United States Patent
Go et al.

(10) Patent No.: US 9,613,800 B2
(45) Date of Patent: Apr. 4, 2017

(54) METHODS OF MANUFACTURING SEMICONDUCTOR DEVICES INCLUDING AN OXIDE LAYER

(71) Applicant: Samsung Electronics Co., Ltd., Suwon-si, Gyeonggi-do (KR)

(72) Inventors: Hyun-Yong Go, Suwon-si (KR);
Jin-Gyun Kim, Suwon-si (KR);
Dong-Kyum Kim, Suwon-si (KR);
Jung-Ho Kim, Seongnam-si (KR);
Koong-Hyun Nam, Seoul (KR);
Sung-Hae Lee, Suwon-si (KR);
Eun-Young Lee, Hwaseong-si (KR);
Jung-Geun Jee, Seoul (KR);
Eun-Yeoung Choi, Seoul (KR);
Ki-Hyun Hwang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/625,388

(22) Filed: Feb. 18, 2015

(65) Prior Publication Data
US 2015/0235836 A1    Aug. 20, 2015

(30) Foreign Application Priority Data
Feb. 20, 2014 (KR) .................. 10-2014-0019412

(51) Int. Cl.
*H01L 21/02* (2006.01)
*H01L 21/687* (2006.01)
*C23C 16/01* (2006.01)
*C23C 16/40* (2006.01)
*C23C 16/455* (2006.01)
*H01L 27/11582* (2017.01)

(52) U.S. Cl.
CPC .......... *H01L 21/0228* (2013.01); *C23C 16/01* (2013.01); *C23C 16/40* (2013.01); *C23C 16/45525* (2013.01); *H01L 21/02164* (2013.01); *H01L 21/02172* (2013.01); *H01L 21/02175* (2013.01); *H01L 21/02211* (2013.01); *H01L 21/02219* (2013.01); *H01L 21/68771* (2013.01); *H01L 27/11582* (2013.01)

(58) Field of Classification Search
CPC ................. H01L 21/0228; C23C 16/45525
USPC .................................. 438/294, 782
See application file for complete search history.

(56) References Cited

U.S. PATENT DOCUMENTS

| 6,391,803 | B1 | 5/2002 | Kim et al. | |
|---|---|---|---|---|
| 7,220,671 | B2 * | 5/2007 | Simka | C23C 16/18 257/17 |
| 8,187,679 | B2 * | 5/2012 | Dickey | C23C 16/452 427/569 |

(Continued)

*Primary Examiner* — Moazzam Hossain
(74) *Attorney, Agent, or Firm* — Harness, Dickey & Pierce, P.L.C.

(57) ABSTRACT

In a method of forming an oxide layer of a semiconductor process, a preliminary precursor flow is provided on a substrate in a deposition chamber to form a preliminary precursor layer, a precursor flow and a first oxidizing agent flow are provided on the preliminary precursor layer alternately and repeatedly to form precursor layers and first oxidizing agent layers alternately stacked on the preliminary precursor layer, and a second oxidizing agent flow is provided on the precursor layer or the first oxidizing agent layer alternately stacked to form a second oxidizing agent layer.

8 Claims, 27 Drawing Sheets

(56) References Cited

U.S. PATENT DOCUMENTS

| | | | |
|---|---|---|---|
| 8,343,279 B2 | 1/2013 | Myo et al. | |
| 8,360,001 B2 | 1/2013 | Todd et al. | |
| 8,460,753 B2* | 6/2013 | Xiao | C23C 16/401 117/84 |
| 2002/0197864 A1* | 12/2002 | Sneh | C23C 16/44 438/680 |
| 2004/0033698 A1* | 2/2004 | Lee | C23C 16/401 438/758 |
| 2005/0170667 A1* | 8/2005 | Conley, Jr. | C23C 16/40 438/785 |
| 2006/0223300 A1* | 10/2006 | Simka | C23C 16/18 438/618 |
| 2007/0111545 A1* | 5/2007 | Lee | C23C 16/401 438/787 |
| 2008/0026162 A1* | 1/2008 | Dickey | C23C 16/452 427/569 |
| 2010/0062149 A1 | 3/2010 | Ma et al. | |
| 2010/0227476 A1 | 9/2010 | Peck | |
| 2011/0263115 A1 | 10/2011 | Ganguli et al. | |
| 2011/0275215 A1 | 11/2011 | Gatineau et al. | |
| 2012/0021252 A1 | 1/2012 | Lee | |
| 2012/0207948 A1 | 8/2012 | Lee | |
| 2013/0115763 A1 | 5/2013 | Takamure et al. | |
| 2013/0130405 A1* | 5/2013 | Verhaverbeke | G11B 5/84 438/3 |
| 2014/0273510 A1* | 9/2014 | Chen | H01L 21/02337 438/763 |

\* cited by examiner

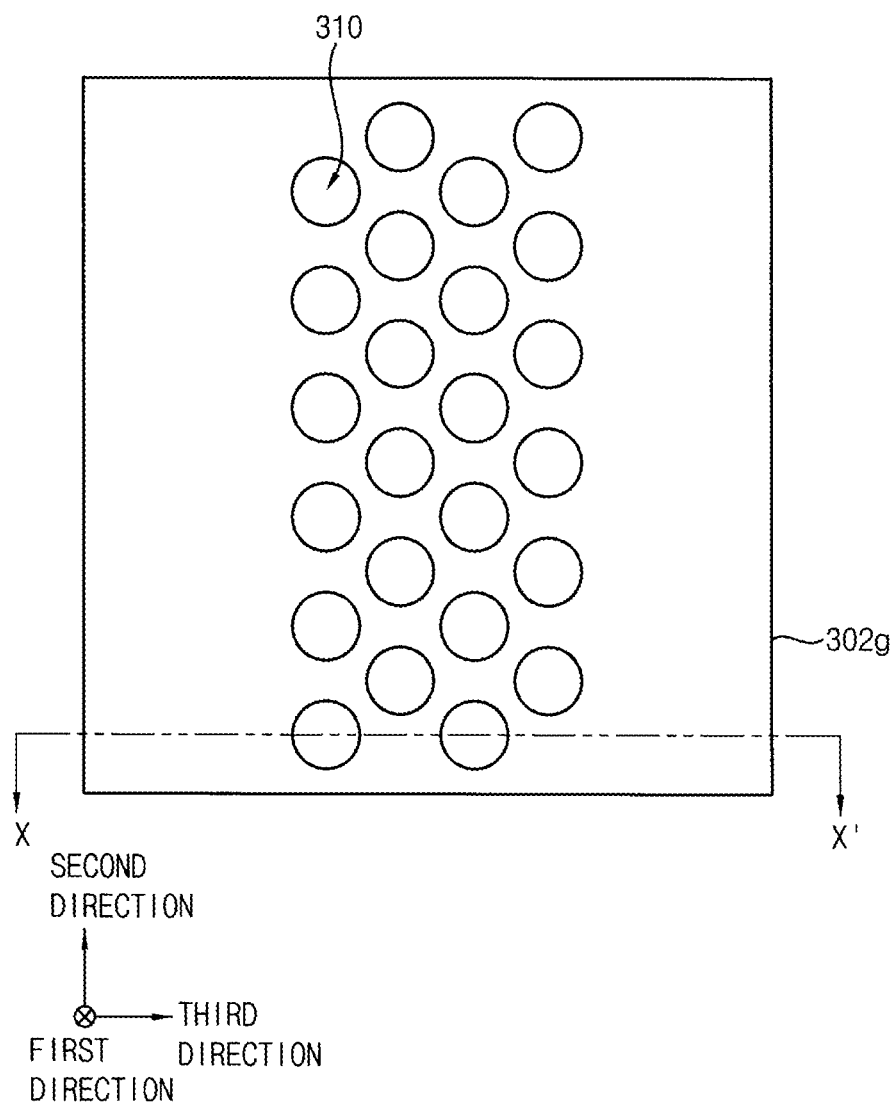

METHODS OF MANUFACTURING SEMICONDUCTOR DEVICES INCLUDING AN OXIDE LAYER

CROSS-REFERENCE TO RELATED APPLICATION

This application claims priority under 35 USC §119 to Korean Patent Application No. 10-2014-0019412, filed on Feb. 20, 2014 in the Korean Intellectual Property Office (KIPO), the contents of which are incorporated by reference herein in their entirety.

BACKGROUND

1. Field

Example embodiments relate to methods of manufacturing semiconductor devices. More particularly, example embodiments relate to methods of manufacturing semiconductor devices including oxide layers.

2. Description of Related Art

An oxide layer, such as a silicon oxide layer or a metal oxide layer, may be used as a gate insulation layer or an insulating interlayer of various semiconductor devices. The oxide layer may be formed by a deposition process, e.g., a chemical vapor deposition (CVD) process or an atomic layer deposition (ALD) process.

For example, an object such as a semiconductor wafer (e.g., silicon wafer) may be loaded into a process chamber. A precursor material including (e.g., a silicon precursor or a metal precursor) and an oxidizing agent may be introduced into the process chamber to form the oxide layer on the object. However, a conductive structure such as a wiring or a gate electrode may be oxidized during the deposition process.

SUMMARY

Example embodiments relate to a method of manufacturing a semiconductor device including an oxide layer.

According to example embodiments, there is provided a method of forming an oxide layer of a semiconductor device. In the method, a substrate may be loaded into a deposition chamber. A preliminary precursor flow is provided on the substrate to form a preliminary precursor layer. A precursor flow and a first oxidizing agent flow are provided on the preliminary precursor layer alternately and repeatedly to form precursor layers and first oxidizing agent layers alternately stacked on the preliminary precursor layer. A second oxidizing agent flow is provided on the precursor layer or the first oxidizing agent layer to form a second oxidizing agent layer.

In example embodiments, the preliminary precursor flow and the precursor flow may include one of a silicon precursor having ligands combined to a silicon atom and an organometallic precursor having ligands combined to a metal atom.

In example embodiments, the preliminary precursor layer may have one of a silicon atomic layer structure and a metal atomic layer structure.

In example embodiments, the first oxidizing agent flow and the second oxidizing agent flow may include a mixture gas of hydrogen ($H_2$) and an oxidizing agent. The oxidizing agent may be oxygen ($O_2$).

In example embodiments, a conductive layer may be further formed on the substrate before the preliminary precursor layer is formed. The preliminary precursor layer may be formed on the conductive layer.

In example embodiments, the deposition chamber may be an atomic layer deposition (ALD) process chamber including a susceptor and a plurality of slots on the susceptor. The providing the preliminary precursor flow on the substrate may include providing the preliminary precursor flow on a plurality of substrates. A plurality of the substrates may be placed on the slots, respectively.

In example embodiments, the deposition chamber may include a conduit structure defining a precursor flow path and a conduit structure defining an oxidizing agent flow path respectively over the susceptor. At least one of the preliminary precursor flow and the precursor flow may be provided through the precursor flow path to form a precursor deposition region. At least one of the first oxidizing agent flow and the second oxidizing agent flow may be provided through the oxidizing agent flow path to form an oxidizing agent deposition region. The deposition chamber may be configured to provide the precursor flow and the first oxidizing agent flow simultaneously.

In example embodiments, the method may include rotating the susceptor when the preliminary precursor flow and the precursor flow are provided. The preliminary precursor layer and the precursor layer may be formed on corresponding ones of the plurality of substrates that pass through the precursor deposition region while rotating the susceptor. The first oxidizing agent layer and the second oxidizing agent layer may be formed on corresponding ones of the plurality of substrates that pass through the oxidizing agent deposition region while rotating the susceptor.

In example embodiments, the preliminary precursor layer may be formed while the susceptor is rotated n number of rotations. The precursor layers and the first oxidizing agent layers may be repeatedly formed while the susceptor is rotated m number of rotations. Here, n and m may be positive integers and m is greater than n.

In example embodiments, the precursor flow may be ceased before completing the m number of rotations to remove the precursor deposition region.

In example embodiments, providing the preliminary precursor flow on the substrate to form the preliminary precursor layer may be performed in an atmosphere deficient in oxygen.

In example embodiments, a temperature in the deposition chamber may be maintained from about 400° C. to about 800° C. during the providing the preliminary precursor flow and the providing the precursor flow.

According to example embodiments, there is provided a method of forming an oxide layer of a semiconductor device. In the method, a stacked structure that includes a plurality of channels extending through a plurality of insulating interlayer patterns and gate electrode alternately stacked on each other on a substrate is formed, and the stacked structure includes at least one opening that exposes a portion of the substrate. A preliminary precursor flow is provided on an innerwall of the at least one opening to form a preliminary precursor layer on the innerwall. A precursor flow and a first oxidizing agent flow are provided on the preliminary precursor layer alternately and repeatedly to form precursor layers and first oxidizing agent layers alternately stacked on each other. A second oxidizing agent flow is provided on the precursor layers and the first oxidizing agent layers alternately stacked on each other to form a filling layer in the opening.

In example embodiments, the preliminary precursor flow and the precursor flow may include a silicon precursor having ligands combined to a silicon atom. The first oxidizing agent flow and the second oxidizing agent flow may include a mixture gas of hydrogen and an oxidizing agent. The oxidizing agent may be oxygen ($O_2$).

In example embodiments, an impurity region may be further formed at an upper portion of the portion of the substrate exposed by the at least one opening.

According to example embodiments, a method of forming an oxide layer of a semiconductor device includes forming a preliminary precursor layer on an object by performing a deposition process using a preliminary precursor material in a chamber containing the object, forming a plurality of precursor layers and first oxidizing agent layers alternately on each other by alternately performing a deposition process using a precursor material and a performing a deposition process using a first mixture including an oxidizing gas in the chamber containing the object after the forming the preliminary precursor layer, and forming a second oxidizing agent layer on the plurality of precursor layer and first oxidizing agent layers by performing a deposition process using a second mixture including an oxidizing gas in the process chamber containing the object.

In example embodiments, the deposition process using the preliminary precursor material and the deposition process using the precursor material are an atomic layer deposition (ALD) process excluding at least one of oxygen ($O_2$) and ozone ($O_3$) gas, and a temperature of the chamber containing the object is maintained in a range of about 400° C. to about 800° C. during the deposition process using the preliminary precursor material and the deposition process using the precursor material.

In example embodiments, the preliminary precursor material may be one of a silicon precursor having ligands combined to a silicon atom and an organometallic precursor having ligands combined to a metal atom. The precursor material may be one of a silicon precursor having ligands combined to a silicon atom and an organometallic precursor having ligands combined to a metal atom.

In example embodiments, the first and second mixture may include hydrogen ($H_2$). The oxidizing gas in the first mixture may include oxygen ($O_2$). The oxidizing gas in the second mixture may include oxygen ($O_2$).

In example embodiments, the chamber may be a deposition chamber in an atomic layer deposition (ALD) apparatus. The ALD apparatus may include a susceptor configured to be rotated and to support the object if the object is a wafer, a conduit structure defining an oxidizing agent flow path into the chamber over the susceptor, and a conduit structure defining a precursor flow path into the chamber over the susceptor. The ALD apparatus may be configured to form a preliminary precursor deposition region or precursor deposition region in the chamber respectively, by providing the preliminary precursor material or precursor material, respectively, through the precursor flow path into the chamber and excluding at least one of oxygen ($O_2$) and ozone ($O_3$) gas in the chamber during the providing the preliminary precursor material or precursor material. The ALD apparatus may be configured to form a first oxidizing agent deposition region or a second oxidizing agent deposition region in the chamber, respectively, by providing the first mixture including an oxidizing gas or the second mixture including an oxidizing gas through the oxidizing agent flow path into the chamber. The forming the preliminary precursor layer may include forming the preliminary precursor region in the chamber and rotating the susceptor while the object is on the susceptor so the object passes through the preliminary precursor region. The forming the plurality of precursor layers and first oxidizing layers alternately on each other may include repeatedly rotating the susceptor while the object is on the susceptor so the object repeatedly passes through the precursor region and the first oxidizing agent region in the chamber. The forming the second oxidizing agent layer may include forming the second oxidizing agent region in the chamber and rotating the susceptor while the object is on the susceptor so the object passes through the second oxidizing agent region.

According to example embodiments, a mixture gas of hydrogen and oxygen which has a strong oxidizing power may be used so that insulating and dielectric properties of the silicon oxide layer may be enhanced. Further, a silicon precursor may be provided into a process chamber before an introduction of an oxidizing agent such that a preliminary silicon atomic layer may be formed on an object. Therefore, a conductive structure on the object such as a gate electrode may be limited (and/or prevented) from being oxidized by the oxidizing agent.

BRIEF DESCRIPTION OF THE DRAWINGS

The foregoing and other features of example embodiments will be apparent from the more particular description of non-limiting embodiments, as illustrated in the accompanying drawings in which like reference characters refer to like parts throughout the different views. The drawings are not necessarily to scale, emphasis instead being placed upon illustrating features of example embodiments. In the drawings.

DESCRIPTION OF EMBODIMENTS

Figure 1:
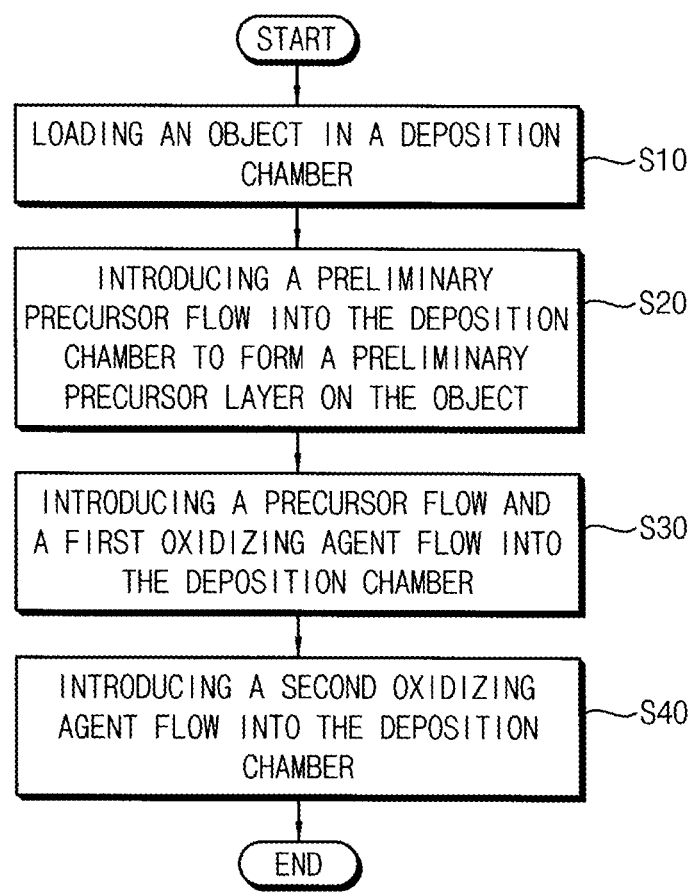
FIG. 1 is a flow chart illustrating a method of forming an oxide layer in accordance with example embodiments.

Example embodiments will be described more fully hereinafter with reference to the accompanying drawings, in which some example embodiments are shown. Example embodiments may, however, be embodied in many different forms and should not be construed as limited to the embodiments set forth herein. Rather, these example embodiments are provided so that this description will be thorough and complete, and will fully convey the scope of inventive concepts to those skilled in the art. In the drawings, the sizes and relative sizes of layers and regions may be exaggerated for clarity. Like reference characters and/or numerals in the drawings denote like elements, and thus their description may be omitted.

It will be understood that when an element or layer is referred to as being "on," "connected to", or "coupled to" another element or layer, it can be directly on, directly connected, or directly coupled to the other element or layer or intervening elements or layers may be present. In contrast, when an element is referred to as being "directly on," "directly connected to", or "directly coupled to" another element or layer, there are no intervening elements or layers present. Other words used to describe the relationship between elements or layers should be interpreted in a like fashion (e.g., "between" versus "directly between," "adjacent" versus "directly adjacent," "on" versus "directly on"). As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a flow chart illustrating a method of forming an oxide layer in accordance with example embodiments. FIGS. 2 to 5B are cross-sectional views illustrating a method of forming an oxide layer in accordance with example embodiments. For example, FIGS. 1 to 5B illustrate a method of forming an oxide layer included in a semiconductor device.

Figure 2:
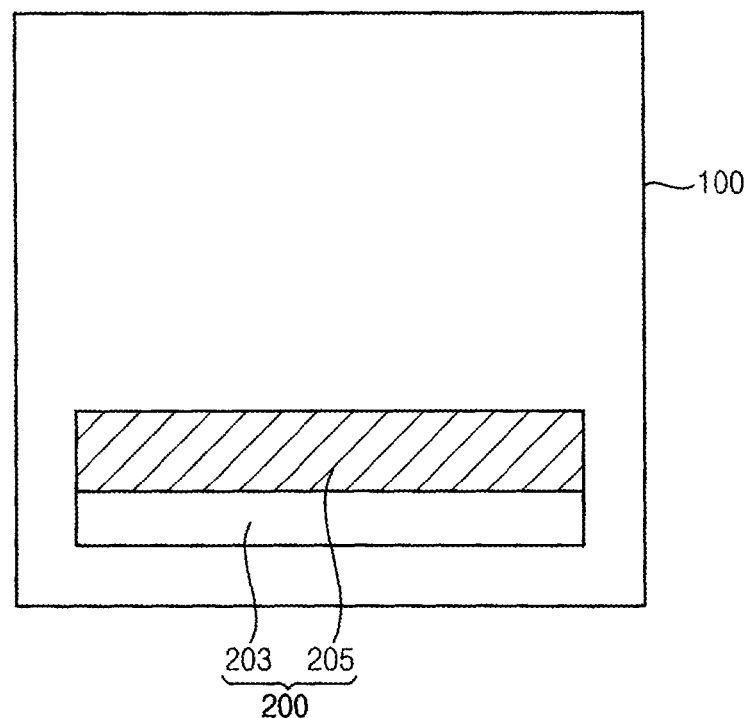
FIGS. 2 to 5B are cross-sectional views illustrating a method of forming an oxide layer in accordance with example embodiments.

Referring to FIGS. 1 and 2, in step S10, an object 200 may be loaded in a deposition chamber 100.

In example embodiments, the deposition chamber 100 may be a chamber for an ALD process. The deposition chamber 100 may include a structure on which the object 200 is loaded. For example, the deposition chamber 100 may include a susceptor on which the object 200 is loaded. A plurality of the objects 200 may be placed horizontally on the susceptor, and the susceptor may be rotated such that an oxide layer may be deposited on each object 200. The deposition chamber 100 may be a single wafer type chamber. Although a case where the object 200 (or objects) are loaded onto a susceptor is described, example embodiments are not limited thereto. For example, objects may be loaded onto an electrostatic chuck instead of a susceptor The deposition chamber 100 may include at least one flow path through which a reaction gas is provided. In example embodiments, the deposition chamber 100 may include a precursor flow path and an oxidizing agent flow path through which a precursor gas and an oxidizing agent gas may be provided, respectively. The precursor flow path and the oxidizing agent flow path may be included independently in the deposition chamber 100. In example embodiments, the deposition chamber 100 may further include a flow path for providing a purge gas.

The object 200 may include a substrate 203 and an object layer 205 formed on the substrate 203. In example embodiments, the substrate 203 may include a semiconductor wafer such as silicon wafer or a germanium wafer.

In example embodiments, the object layer 205 may be a conductive layer including a metal, a metal nitride, a metal silicide or doped polysilicon. For example, the object layer 205 may include a metal such as tungsten (W), titanium (Ti), tantalum (Ta), aluminum (Al) or the like, and/or a nitride thereof, and/or a silicide thereof.

In example embodiments, the object layer 205 may be a conductive structure including a gate electrode, a wiring, a contact, a plug, or the like.

Figure 3:
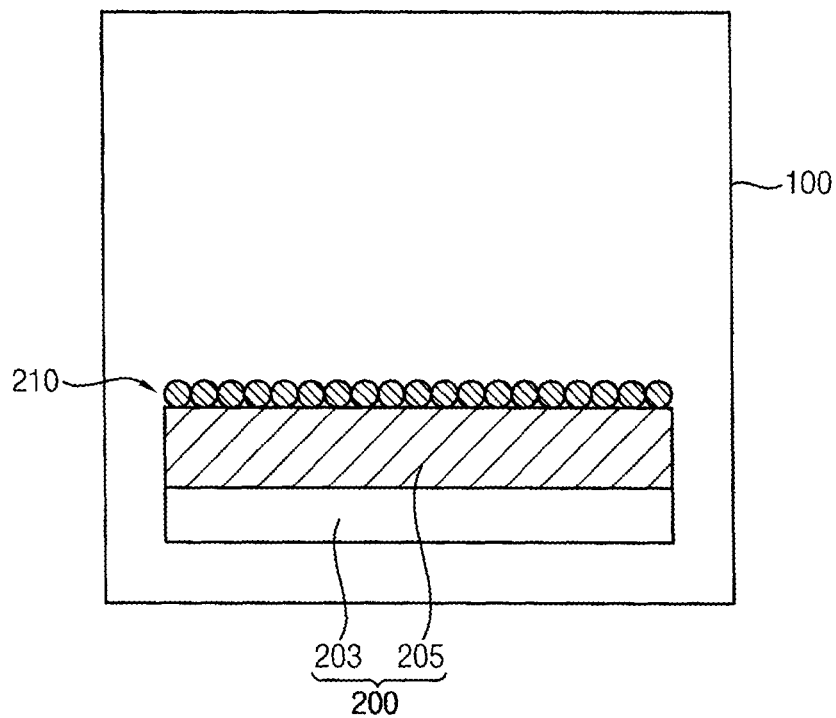

Referring to FIGS. 1 and 3, in step S20, a preliminary precursor flow including a precursor material may be introduced into the deposition chamber 100 to form a preliminary precursor layer 210 on the object 200.

In example embodiments, the preliminary precursor flow may include a silicon precursor in which at least one ligand may be combined to a silicon atom as a central atom. Examples of the silicon precursor may include tetrakis ethyl methyl amino silicon (TEMAS), tetrakis di-methyl amino silicon (TDMAS), tetrakis di-ethyl amino silicon (TDEAZ), or the like.

In example embodiments, the precursor material may include a metal as the central atom. The metal may be, e.g., tantalum (Ta), tungsten (W), aluminum (Al), hafnium (Hf) or zirconium (Zr). In this case, the precursor material may include an organometallic precursor, e.g., $Zr(OtBu)_4$, tetrakis ethyl methyl amino zirconium (TEMAZ), tetrakis di-methyl amino zirconium (TDMAZ), tetrakis di-ethyl amino zirconium (TDEAZ), $Hf(OtBu)_4$, tetrakis ethyl methyl amino hafnium (TEMAH), tetrakis di-methyl amino hafnium (TDMAH), tetrakis di-ethyl amino hafnium (TDEAH), tri methyl aluminum (TMA), or the like.

In example embodiments, the preliminary precursor flow may be introduced into the deposition chamber 100 together with a carrier gas. The carrier gas may include an inert gas, e.g., argon (Ar), hellium (He), krypton (Kr), xenon (Xe), or the like.

In example embodiments, a temperature in the deposition chamber 100 may be maintained at a range from about 400° C. to about 800° C. If the temperature in the deposition chamber 100 is less than about 400° C., the precursor material contained in the preliminary precursor flow may not be sufficiently chemisorbed on the object layer 100. If the temperature in the deposition chamber 100 exceeds about 800° C., the silicon precursors may be crystallized and a CVD property may be prevalent in a deposition process. Thus, the preliminary precursor layer 210 having a desired atomic layer structure may not be obtained.

A chemisorption between the precursor material and the object layer 205 may occur at the temperature of the above-mentioned range. Accordingly, the preliminary precursor layer 210 having the atomic layer structure may be formed on the object layer 205. In example embodiments, if the silicon precursor is used as the precursor material, the preliminary precursor layer 210 may substantially have a silicon atomic layer structure. In example embodiments, if the organometallic precursor is used as the precursor material, the preliminary precursor layer 210 may substantially have a metal atomic layer structure.

The ligands combined to the silicon atom may be thermally decomposed to be separated or detached from the silicon atom.

In example embodiments, a purge gas may be provided into the deposition chamber 100 to perform a first pumping process. The precursor materials that are physisorbed or are not adsorbed on the object layer 205 may be removed by the first pumping process. The ligands separated from the precursor material may be also removed. The purge gas may include, e.g., nitrogen ($N_2$).

In example embodiments, the deposition chamber 100 may be maintained in an atmosphere deficient in oxygen while forming the preliminary precursor layer 210, but example embodiments are not limited thereto. For example, an oxygen-containing material such as oxygen ($O_2$) or ozone ($O_3$) may be excluded from the deposition chamber 100. Accordingly, a formation of an oxygen atomic layer or an adsorption of oxygen atoms before the formation of the preliminary precursor layer 210 may be limited (and/or prevented).

In example embodiments, the deposition chamber 100 may be vacuumed during the introduction of the preliminary precursor flow.

Figure 4A:
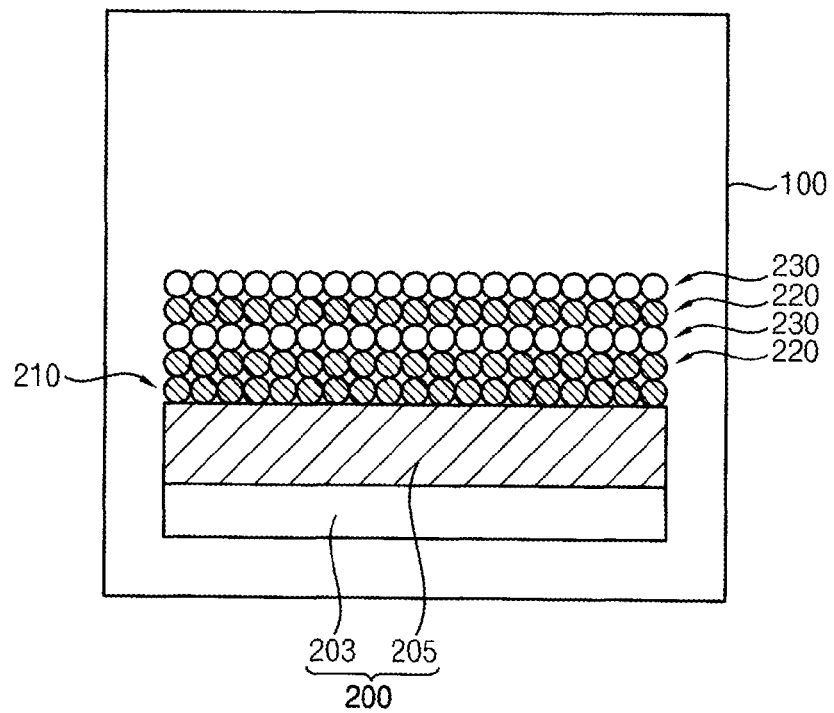
Figure 4B:
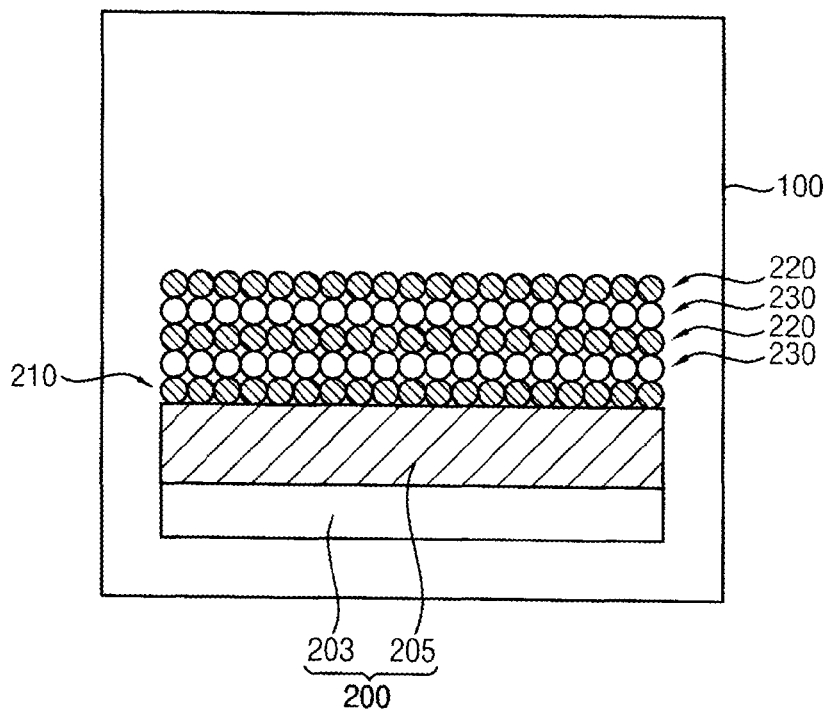

Referring to FIGS. 1, 4A and 4B, in step S30, a precursor flow and a first oxidizing agent flow may be introduced into the deposition chamber 100.

In example embodiments, the introduction of the preliminary precursor flow may be terminated when the preliminary precursor layer 210 is formed. The precursor flow and the first oxidizing agent flow may be provided on the preliminary precursor layer 210 to form a precursor layer 220 and a first oxidizing agent layer 230 thereon.

As described above, the precursor flow and the first oxidizing agent may be introduced through the precursor flow path and the oxidizing agent flow path, respectively, which are individually included in the deposition chamber 100. In example embodiments, the precursor flow and the first oxidizing agent flow may be simultaneously introduced into the deposition chamber 100.

In example embodiments, the precursor flow may include at least one of the above-mentioned precursor materials. For example, the precursor flow may include the silicon precursor such as TEMAS, TDMAS, TDEAZ, or the like. The precursor flow may be introduced together with a carrier gas such as Ar, He, Kr, Xe, or the like.

In example embodiments, the first oxidizing flow may include a strong oxidizing agent so that layer properties, e.g., insulative and dielectric properties of a resultant oxide layer may be improved. For example, the first oxidizing agent flow may include an oxidizing agent having an oxidizing power stronger than oxygen ($O_2$) and ozone ($O_3$). In example embodiments, the first oxidizing agent may include a mixture gas of hydrogen ($H_2$) and oxygen ($O_2$) as the oxidizing agent.

Hydrogen may have a reducing power, and thus hydrogen may accept electrons from oxygen. Accordingly, oxygen radicals may be easily created from oxygen molecules so that the mixture gas of hydrogen and oxygen may have the relatively strong oxidizing power.

If the strong oxidizing agent is used as the first oxidizing agent flow, the object layer 205 including, e.g., a metal may be also oxidized to result in damage or deterioration of the object layer 205. For example, in a case that a native oxide layer is formed on a surface of the object layer 205, the native oxide layer may be extended in the object layer 205 by the first oxidizing agent flow. Thus, a desired thickness of the object layer 205 may not be achieved.

However, according to example embodiments, the preliminary precursor layer 210 may be formed on the object layer 205 using the preliminary precursor flow so that the deterioration of the object layer 205 and an expansion of the native oxide layer may be limited (and/or prevented).

As described above, the object 205 may be loaded on the rotatable susceptor to repeatedly pass through regions adjacent to the precursor flow path and the oxidizing agent flow path. Thus, the precursor layers 220 and the first oxidizing agent layers 230 may be repeatedly and alternately formed on the preliminary precursor layer 210. In example embodiments, each of the precursor layer 220 and the first oxidizing agent layer 230 may be formed substantially as an atomic layer structure. For example, the precursor layer 220 may be formed substantially as a silicon atomic layer or a metal atomic layer. The first oxidizing agent layer 230 may be formed substantially as an oxygen atomic layer.

As illustrated in FIG. 4A, if the object 200 passes through the precursor flow path first, the precursor layer 220 may be formed on the preliminary precursor layer 210, and then the first oxidizing agent layer 230 may be formed on the precursor layer 220.

As illustrated in FIG. 4B, if the object 200 passes through the oxidizing agent flow path first, the first oxidizing agent layer 230 may be formed on the preliminary precursor layer 210, and then the precursor layer 220 may be formed on first oxidizing agent layer 230.

In example embodiments, after the precursor layers 220 and the first oxidizing agent layers 230 are formed alternately and repeatedly by a desired (and/or alternatively predetermined) thickness and a desired (and/or alternatively predetermined) stacked number, a purge gas such as nitrogen gas may be provided into the deposition chamber 100 to perform a second pumping process. The precursor materials that are physisorbed or are not adsorbed on the preliminary precursor layer 210 or the first oxidizing agent layer 230 may be removed. The ligands separated from the precursor material may be also removed.

Figure 5A:
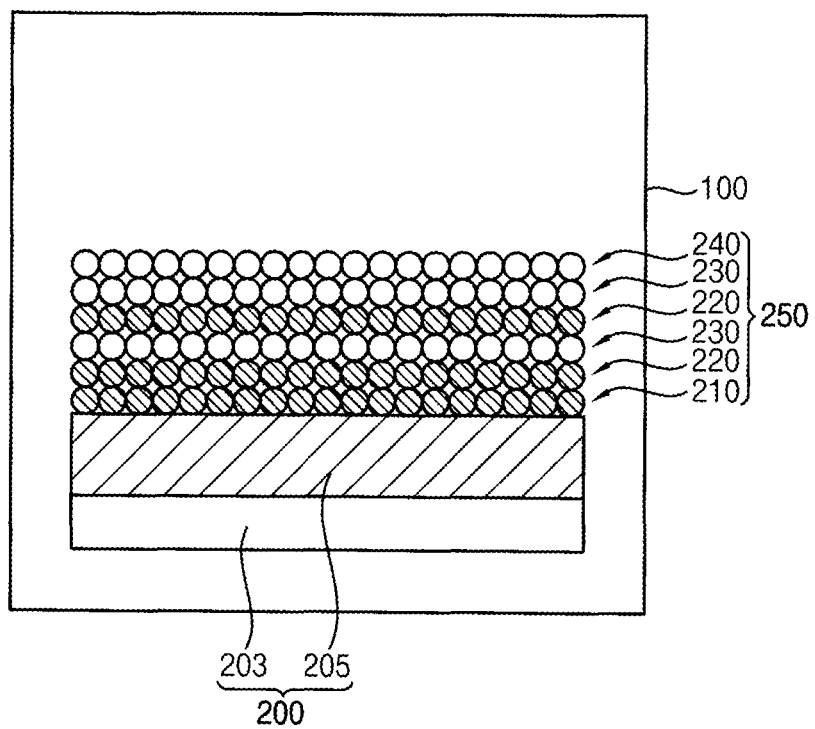
Figure 5B:
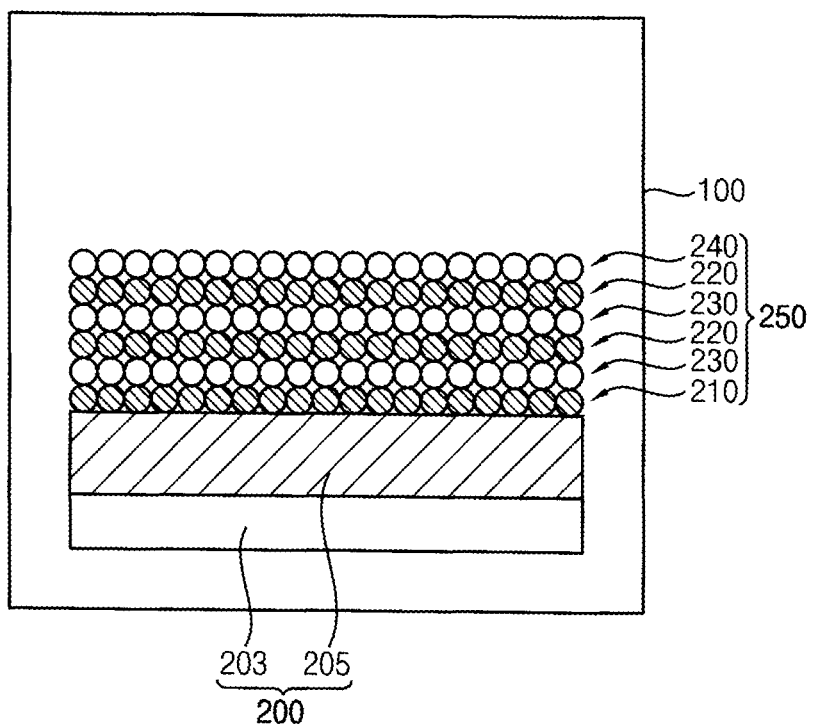

Referring to FIGS. 1, 5A and 5B, in step S40, a second oxidizing agent flow may be introduced into the deposition chamber 100 to additionally form a second oxidizing agent layer 240. Accordingly, an oxide layer 250 including the preliminary precursor layer 210, the precursor layer 220, the first oxidizing agent layer 230 and the second oxidizing agent layer 240 may be obtained.

In example embodiments, the second oxidizing agent layer 240 may be formed substantially as an oxygen atomic layer.

As illustrated in FIG. 5A, if the object 200 passes through the precursor flow path first, the second oxidizing agent layer 240 may be formed on the first oxidizing agent layer 230.

As illustrated in FIG. 5B, if the object 200 passes through the oxidizing agent flow path first, the second oxidizing agent layer 240 may be formed on the precursor layer 220.

According to example embodiments, a mixture gas of hydrogen and oxygen having a strong oxidizing power may be used for forming an oxide layer so that insulative and dielectric properties of the oxide layer may be improved. Additionally, a preliminary precursor flow may be introduced before introducing a precursor and an oxidizing agent to limit (and/or prevent) damages of the object layer 205.

Figure 6:
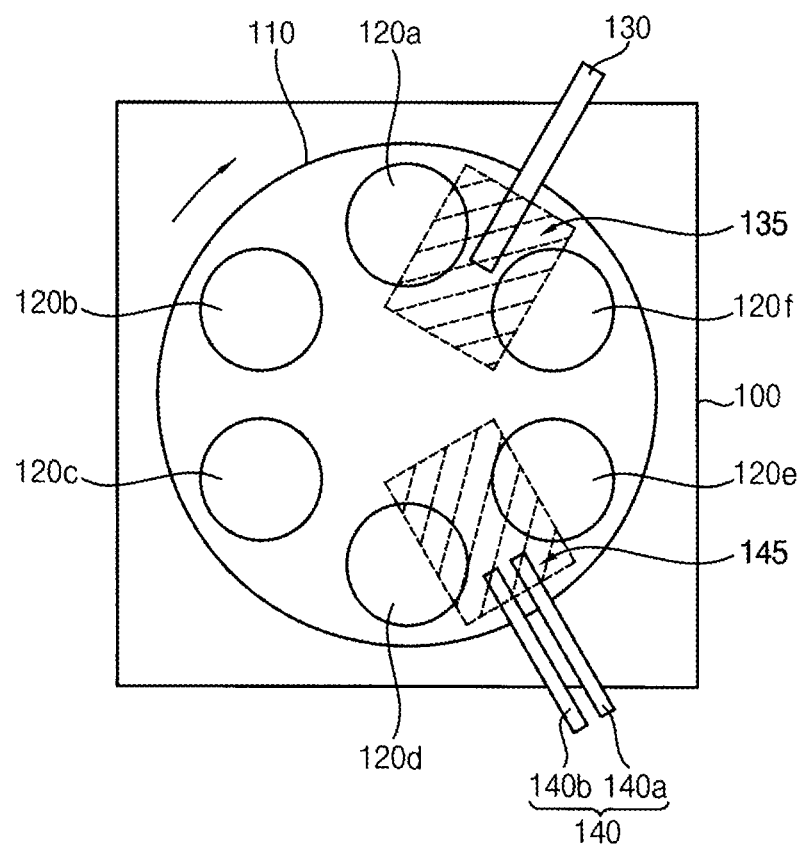
FIG. 6 is a schematic top plan view illustrating an inside of a process chamber in accordance with example embodiments.

FIG. 6 is a schematic top plan view illustrating an inside of a process chamber in accordance with example embodiments;

Referring to FIG. 6, a rotatable susceptor 110 may be placed in the deposition chamber 100, and slots 120 on which objects are loaded may be arranged on the susceptor 110.

For example, the susceptor 110 may be rotated in, e.g., a clockwise direction, and the six slots 120 may be arranged on the susceptor 110. Hereinafter, the slots 120 are indicated as a first slot 120a, a second slot 120b, a third slot 120c, a fourth slot 120d, a fifth slot 120e and a sixth slot 120f.

However, a rotating direction of the susceptor 110 and the number of the slots 120 are not specifically limited herein.

A precursor flow path 130 and an oxidizing agent flow path 140 may be fixed over the susceptor 110 and the slots 120. The precursor flow path 130 may be defined by a conduit structure such as a pipe with at least one flow regulation valve. The oxidizing agent flow path may be defined by a conduit structure such as a pipe with at least one flow regulation valve. The preliminary precursor flow and the precursor flow mentioned above may be introduced into the deposition chamber 100 through the precursor flow path 130. The first and second oxidizing agent flows mentioned above may be introduced into the deposition chamber 100 through the oxidizing agent flow path 140.

In example embodiments, the oxidizing agent flow path 140 may include an oxygen gas flow path 140a and a hydrogen gas flow path 140b. Accordingly, a mixture gas of hydrogen and oxygen having a strong oxidizing power may be introduced into the deposition chamber 100.

When the preliminary precursor flow or the precursor flow is introduced through the precursor flow path 130, a precursor deposition region 135 may be formed at a space adjacent to the precursor flow path 130. Each of the slots 120 may pass through the precursor deposition region 135 such that a preliminary precursor layer or a precursor layer may be formed on each object.

When the first oxidizing agent flow or the second oxidizing agent flow is introduced through the oxidizing agent flow path 140, an oxidizing agent deposition region 145 may be formed at a space adjacent to the oxidizing agent flow path 140. Each of the slots 120 may pass through the oxidizing agent deposition region 145 such that a first oxidizing agent layer or a second oxidizing agent layer may be formed on each object.

In example embodiments, while providing the preliminary precursor flow through the precursor flow path 130, the susceptor 110 may be rotated, e.g., "n" times to form the preliminary precursor layer 210 on the object 200 placed on each slot 120 (e.g., step S20 of FIGS. 1 and 3). Next, while simultaneously providing the precursor flow and the first oxidizing agent flow through the precursor flow path 130 and the oxidizing agent flow path 140, respectively, the susceptor 110 may be additionally rotated "m" times to form the precursor layers 220 and the first oxidizing agent layers 230 on the preliminary precursor layer 210 (e.g., step S30 of FIGS. 1, 4A and 4B). Here, n and m are positive integers, and m is greater than n.

Referring now to FIG. 6, in step S30, the first to fourth slots 120a, 120b, 120c and 120d may pass through the precursor deposition region 135 in advance of the oxidizing agent deposition region 145. Thus, the precursor layer 220 may be formed on the preliminary precursor layer 210 as illustrated in FIG. 4A. The fifth and sixth slots 120e and 120f may pass through the oxidizing agent deposition region 145 in advance of the precursor deposition region 135. Thus, the first oxidizing agent layer 230 may be formed on the preliminary precursor layer 210 as illustrated in FIG. 4B.

The preliminary precursor layer 210 and the precursor layer 220 may have substantially the same compositions and/or layer properties. For example, the preliminary precursor layer 210 and the precursor layer 220 may be formed as substantially the same silicon atomic layer. Thus, the preliminary precursor layer 210 and the precursor layer 220 may be merged with each other to be transformed into a single leveled atomic layer. In this case, a deviation of layer thickness on the slots 120 may be generated. For example, layer thicknesses on the first to fourth slots 120a, 120b, 120c and 120d may be smaller than those on the fifth and sixth slots 120e and 120f.

In example embodiments, in the middle of step S30 for forming the precursor layer 220 and the first oxidizing agent layer 230, the precursor flow may be ceased so that the deviation of the layer thickness may be removed or reduced.

Figure 7:
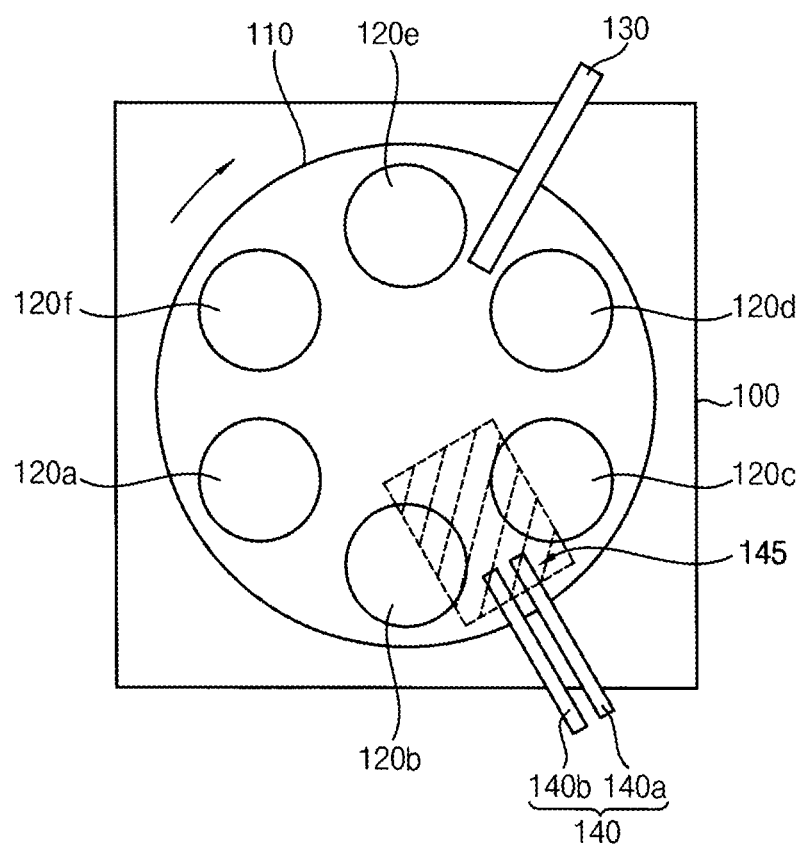
FIG. 7 is a schematic top plan view illustrating an arrangement of slots in the process chamber of FIG. 6 when a precursor flow is ceased.
Figure 8A:
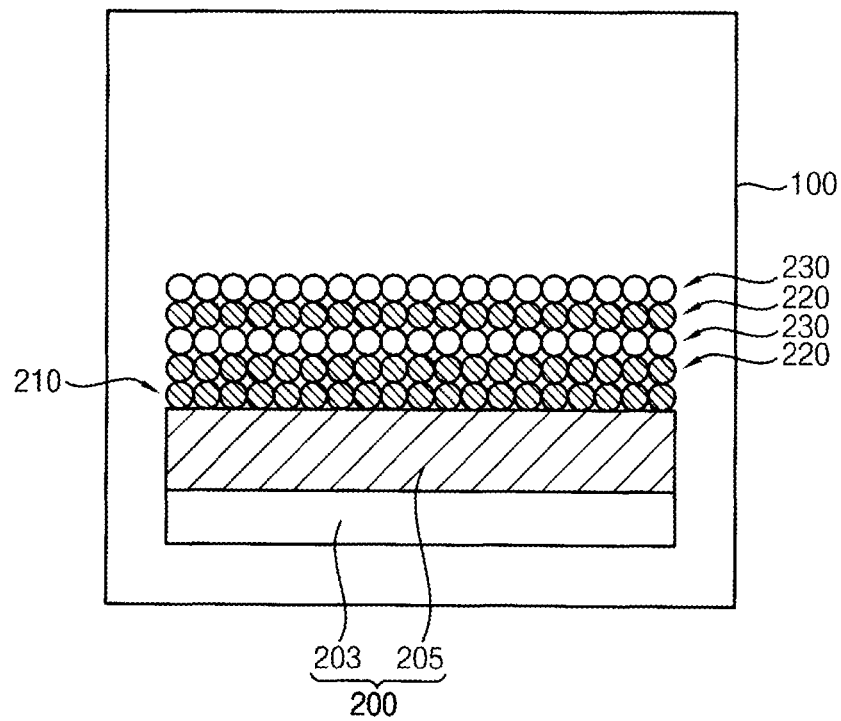
FIGS. 8A and 8B are cross-sectional views illustrating a formation of a precursor layer and a first oxidizing agent layer in accordance with example embodiments.
Figure 8B:
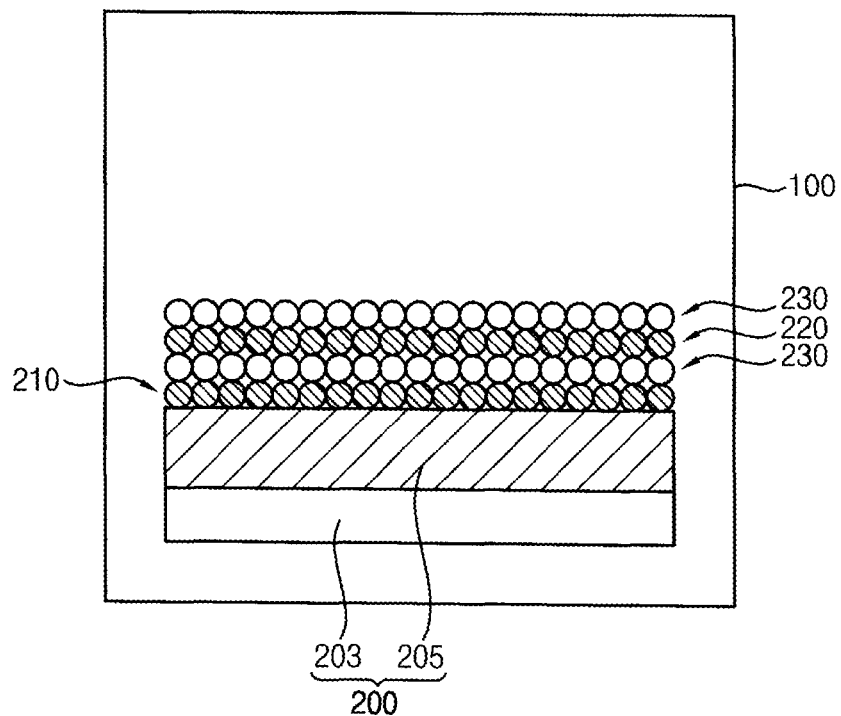

FIG. 7 is a schematic top plan view illustrating an arrangement of slots in the process chamber of FIG. 6 when a precursor flow is ceased. FIGS. 8A and 8B are cross-sectional views illustrating a formation of a precursor layer and a first oxidizing agent layer in accordance with example embodiments.

In example embodiments, the precursor flow path 130 may be blocked or closed before the slots 120 which pass through the oxidizing agent deposition region 145 first may enter the precursor deposition region 135 in, e.g., a last rotation of step S30. For example, the precursor flow may be ceased before completing (m−1) rotation.

Referring to FIG. 7, for example, the precursor flow may be ceased immediately before the fifth slot 120e is located at an initial position of the first slot 120a. Accordingly, the precursor deposition region 135 illustrated in FIG. 6 may be removed. In this case, the number of the precursor layers 220 formed on the fifth and sixth slots 120e and 120f which pass through the oxidizing agent deposition region 140 first may be reduced by a single layer or a single level, because the precursor flow path is ceased or blocked before completing the last rotation.

Referring to FIG. 8A, the precursor layers 220 and the first oxidizing agent layers 230 may be stacked on the objects 200 placed on the first to fourth slots 120a, 120b, 120c and 120d in substantially the same structure as that illustrated in FIG. 4A

Referring to FIG. 8B, the formation of the precursor layer 220 by the last rotation may be omitted on the objects 200 placed on the fifth and sixth slots 120e and 120f. Accordingly, the total number of the precursor layers 220 may be less than that illustrated in FIG. 4B by a single layer or a single level.

In a case that the preliminary precursor layer 210 and the precursor layer 220 are in contact with each other as illustrated in FIG. 8A, the preliminary precursor layer 210 and the precursor layer 220 may be merged with each other to be transformed into a substantially single leveled atomic layer. Therefore, layer structures having a substantially uniform thickness may be formed throughout the slots 120.

Next, as described above, a second oxidizing agent flow may be introduced through the oxidizing agent flow path 140 to additionally form a second oxidizing agent layer. Therefore, an oxide layer having a substantially uniform thickness may be formed on each of the object 200.

FIGS. 9 to 22 are cross-sectional views and top plan views illustrating a method of manufacturing a semiconductor device in accordance with example embodiments. Specifically, FIGS. 9, 11 to 14, and 16 to 22 are cross-sectional views illustrating the method of manufacturing the semiconductor device. FIGS. 10B and 15B are top plan views illustrating the method of manufacturing the semiconductor device. FIGS. 10A and 15A are cross-sectional views taken along lines X-X' and XV-XV' of FIGS. 10B and 15B, respectively.

For example, FIGS. 9 to 22 illustrate a method of manufacturing a vertical memory device including a vertical channel.

In FIGS. 9 to 22, a direction substantially vertical to a top surface of a substrate is referred to as a first direction, and two directions substantially parallel to the top surface of the substrate and substantially perpendicular to each other are referred to as a second direction and a third direction. Additionally, a direction indicated by an arrow in the figures and a reverse direction thereto are considered as the same direction.

Figure 9:
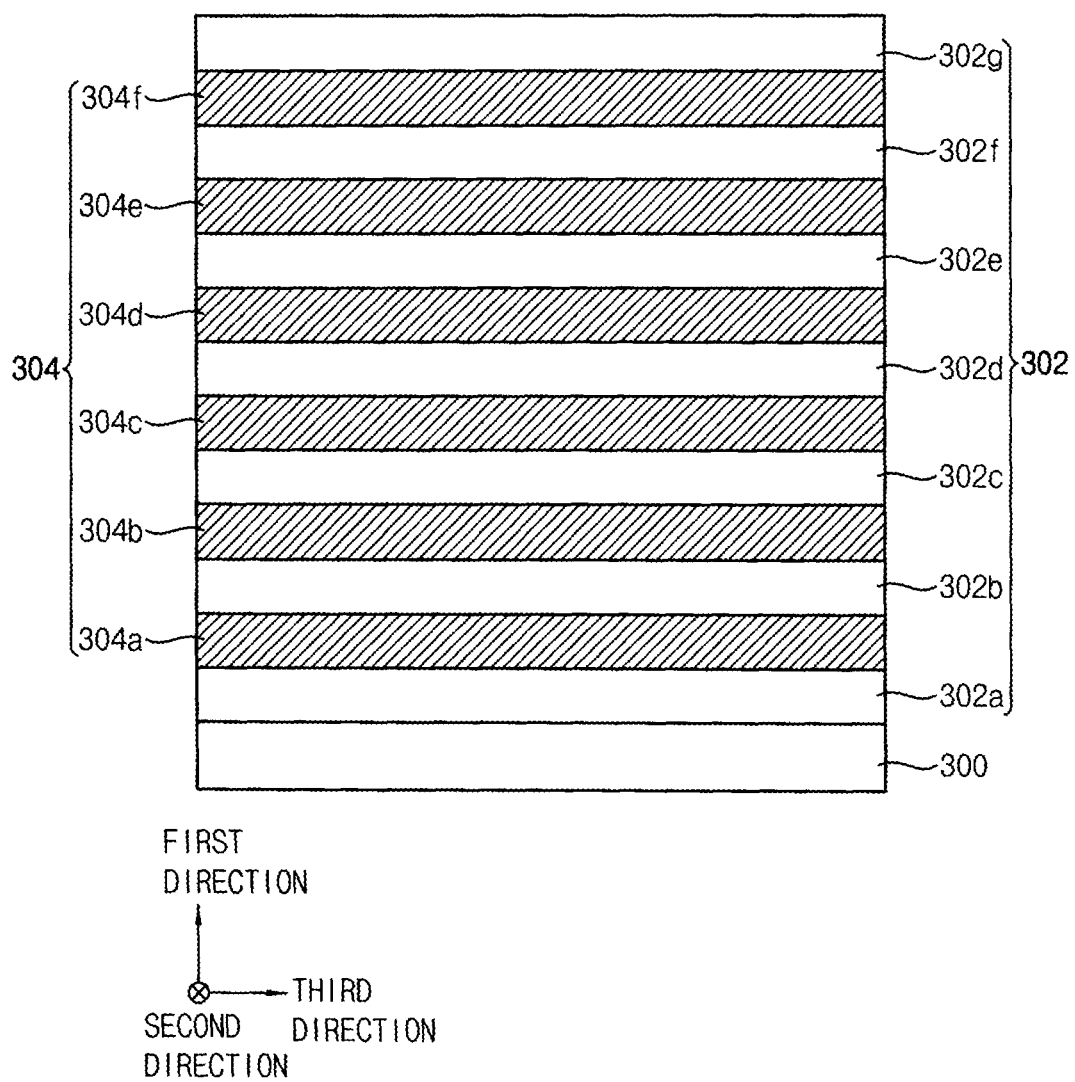
FIGS. 9 to 22 are cross-sectional views and top plan views illustrating a method of manufacturing a semiconductor device in accordance with example embodiments.
Figure 10A:
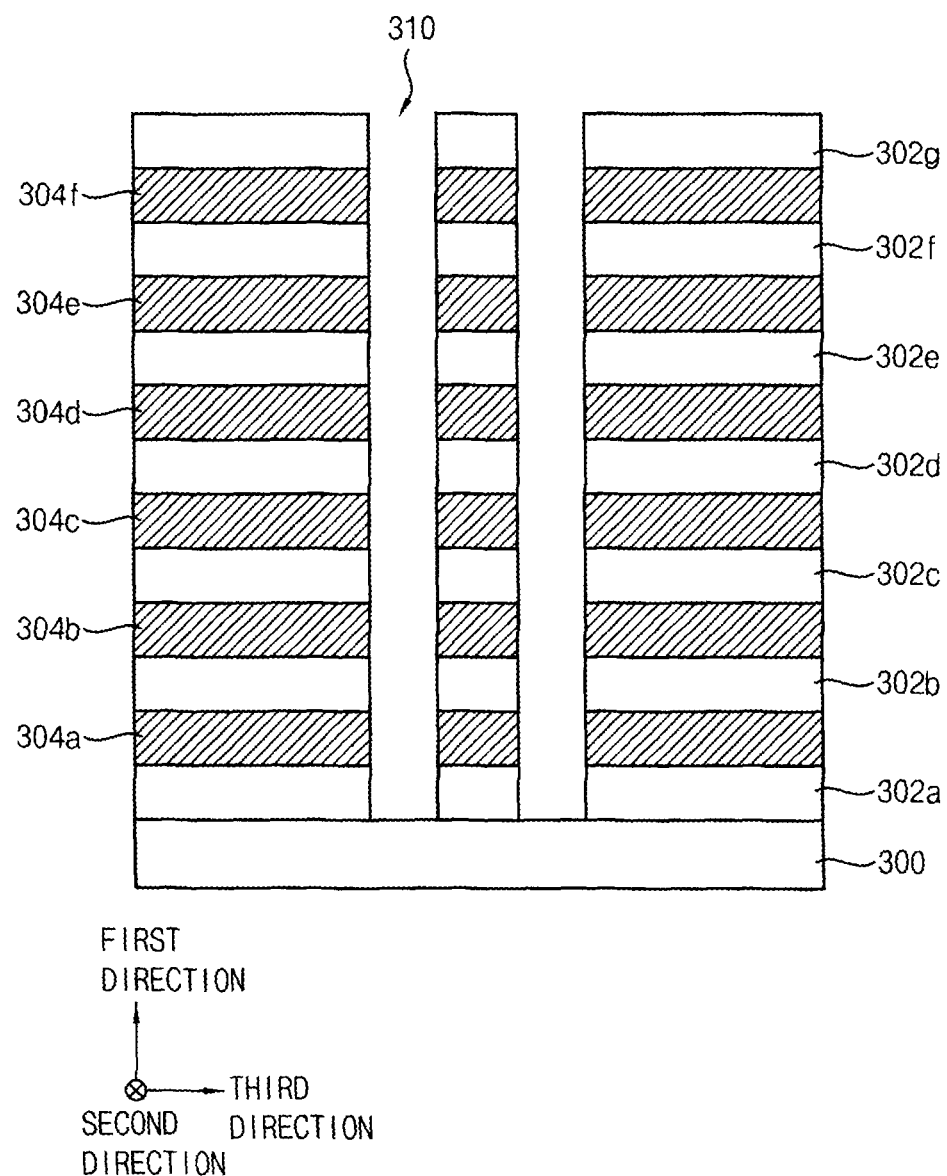

Referring to FIG. 9, insulating interlayers 302 and sacrificial layers 304 may be formed alternately and repeatedly on a substrate 300.

A semiconductor substrate, such as a single crystalline silicon substrate or a single crystalline germanium substrate, may be used as the substrate 300.

The insulating interlayer 302 may be formed using a silicon oxide based material, e.g., silicon dioxide, silicon oxycarbide or silicon oxyfluoride. The sacrificial layer 304 may be formed using a material that may have an etching selectivity with respect to the insulating interlayer 302 and may be easily removed by a wet etching process. For example, the sacrificial layer 304 may be formed using a silicon nitride or silicon boronitride (SiBN). However, example embodiments are not limited thereto.

The insulating interlayer 302 and the sacrificial layer 304 may be formed by a CVD process, a plasma enhanced CVD (PECVD) process, an ALD process, etc. A lowermost insulating interlayer 302a may be formed by a thermal oxidation process on the substrate 300, but example embodiments are not limited thereto.

The sacrificial layers 304 may be removed in a subsequent process to provide spaces for a ground selection line (GSL), a word line and a string selection line (SSL). Thus, the number of the insulating interlayers 302 and the sacrificial layers 304 may be adjusted in consideration of the number of the GSL, the word line and the SSL. For example, each of the GSL and the SSL may be formed at a single level, and the word line may be formed at 4 levels. Accordingly, the sacrificial layers 304 may be formed at 6 levels, and the insulating interlayers 302 may be formed at 7 levels as illustrated in FIG. 9. However, the number of the GSL, the SSL and the word line may be determined in consideration of a circuit design and/or a degree of integration of the vertical memory device.

Referring to FIGS. 10A and 10B, a channel hole 310 may be formed through the insulating interlayers 302 and the sacrificial layers 304.

For example, a hard mask may be formed on an uppermost insulating interlayer 302g. The insulating interlayers 302 and the sacrificial layers 304 may be partially etched by performing, e.g., a dry etching process. The hard mask may be used as an etching mask to form the channel hole 310. A top surface of the substrate 300 may be partially exposed by the channel hole 310. The channel hole 310 may extend in the first direction from the top surface of the substrate 300.

A sidewall of the channel hole 310 may be substantially vertical to the top surface of the substrate 300. However, the sidewall of the channel hole may be tapered due to characteristics of the dry etching process.

The hard mask may include silicon-based or carbon-based spin-on hardmask (SOH) materials, or a photoresist material. The hard mask may be removed after the formation of the channel hole 310 by an ashing process and/or a strip process.

As illustrated in FIG. 10B, a plurality of the channel holes 310 may be formed in the second direction to form a channel hole row. A plurality of the channel hole rows may be formed in the third direction to define a channel hole array.

Figure 11:
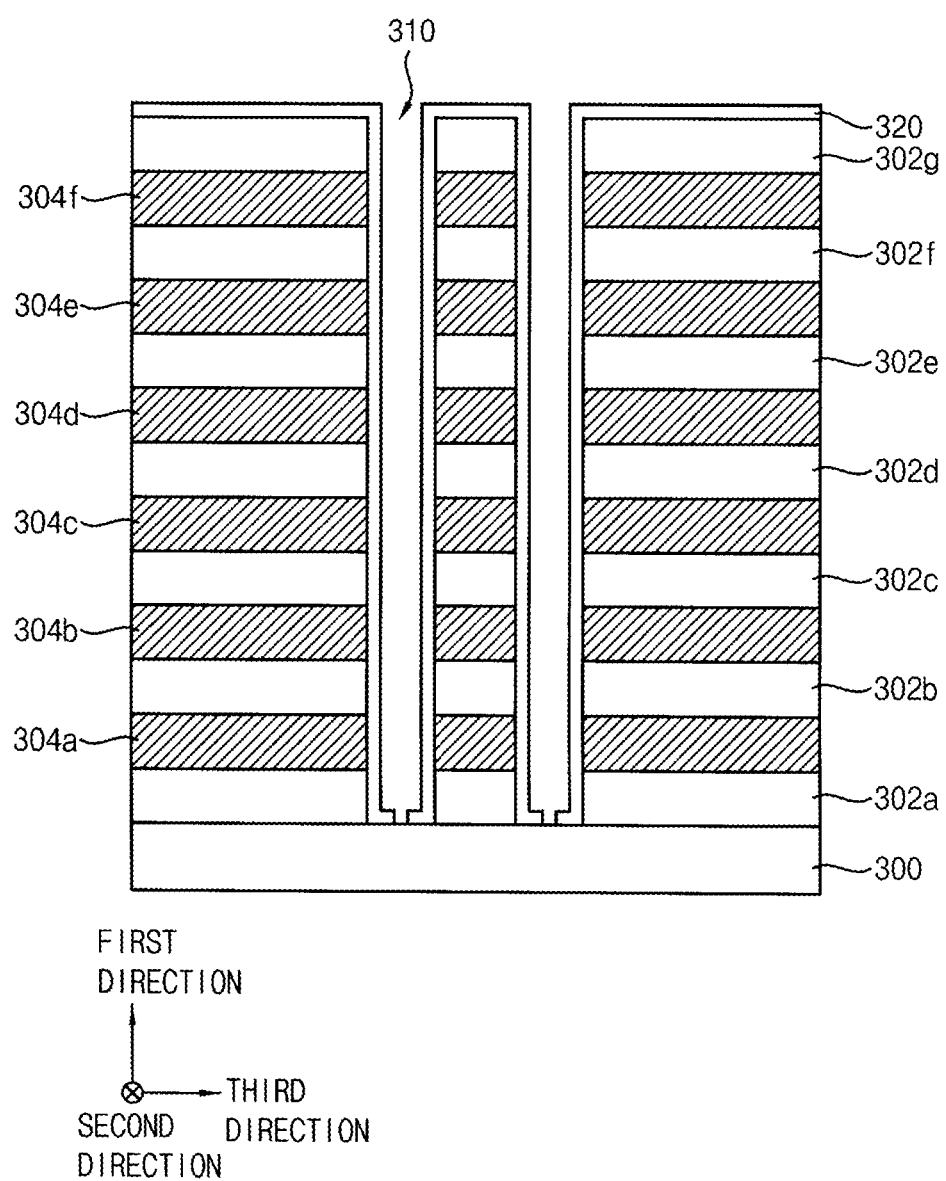

Referring to FIG. 11, a dielectric layer 320 may be formed on a sidewall and a bottom of the channel hole 310 and on the uppermost insulating interlayer 302g.

For example, the dielectric layer 320 may have a multi-stacked structure including a first blocking layer, a charge storage layer and a tunnel insulation layer.

The first blocking layer may be formed using an oxide, e.g., silicon oxide, the charge storage layer may be formed using silicon nitride or a metal oxide, and the tunnel insulation layer may be formed using an oxide, e.g., silicon oxide. For example, the dielectric layer 320 may have an oxide-nitride-oxide (ONO) layer structure. The first blocking layer, the charge storage layer and the tunnel insulation layer may be formed by a CVD process, a PECVD process, an ALD process, etc.

A bottom of the dielectric layer 320 may be partially removed by, e.g., an etch-back process. Accordingly, the bottom of the dielectric layer 320 may be opened in the channel holes 310, and the top surface of the substrate 300 may be exposed through the channel hole 310.

Figure 12:
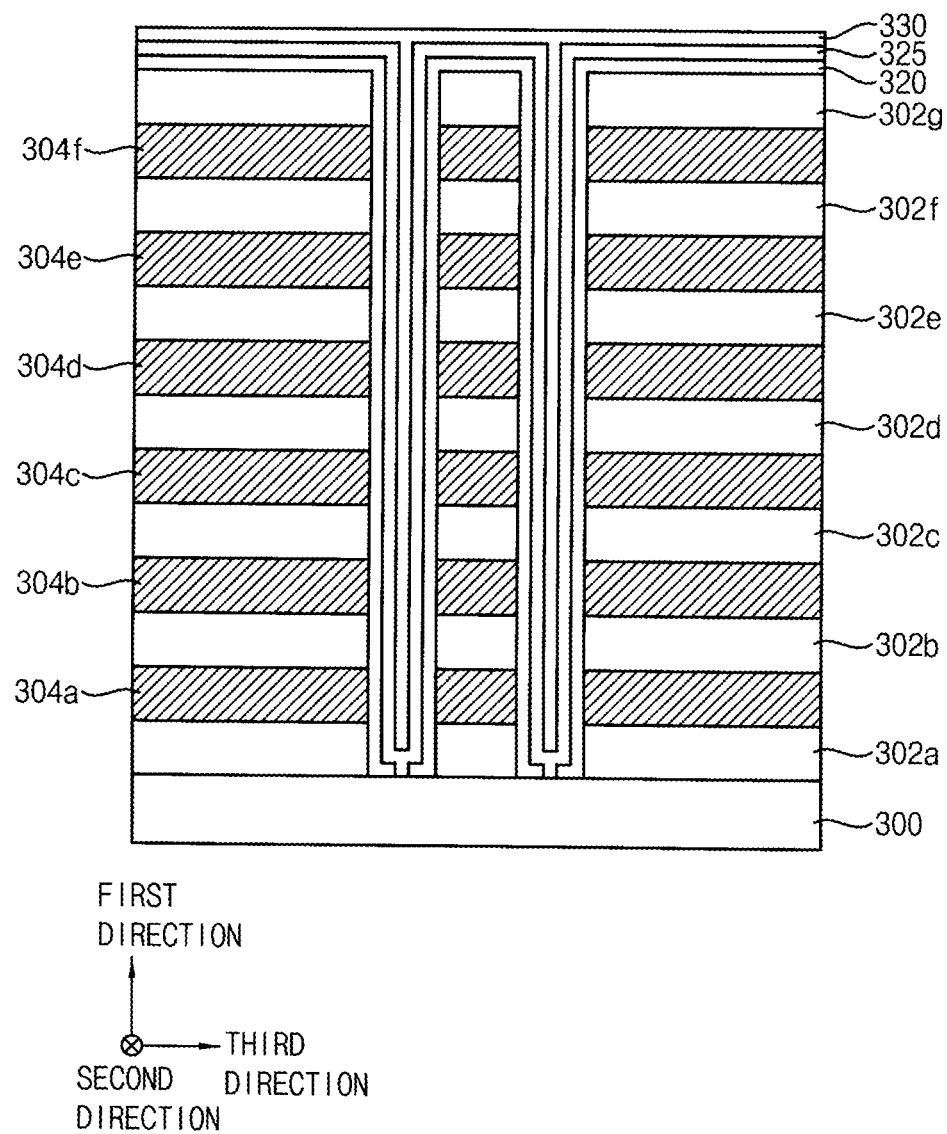

Referring to FIG. 12, a channel layer 325 may be formed on the dielectric layer 320 and the exposed top surface of the substrate 300, and then a first filling layer 330 may be formed on the channel layer 325 to sufficiently fill a remaining portion of the channel hole 310.

The channel layer 325 may be formed using polysilicon or amorphous silicon which may be optionally doped with impurities. In example embodiments, a heat treatment or a laser beam irradiation may be further performed on the channel layer 325. In this case, the channel layer 325 may include single crystalline silicon and defects in the channel layer 325 may be cured. The first filling layer 330 may be formed using an insulation material, e.g., silicon oxide or silicon nitride. The channel layer 325 and the first filling layer 330 may be formed by a CVD process, a PECVD process, an ALD process, etc.

In example embodiments, the channel layer 325 may be formed to fully fill the channel hole 310. In this case, the formation of the first filling layer 330 may be omitted.

Figure 13:
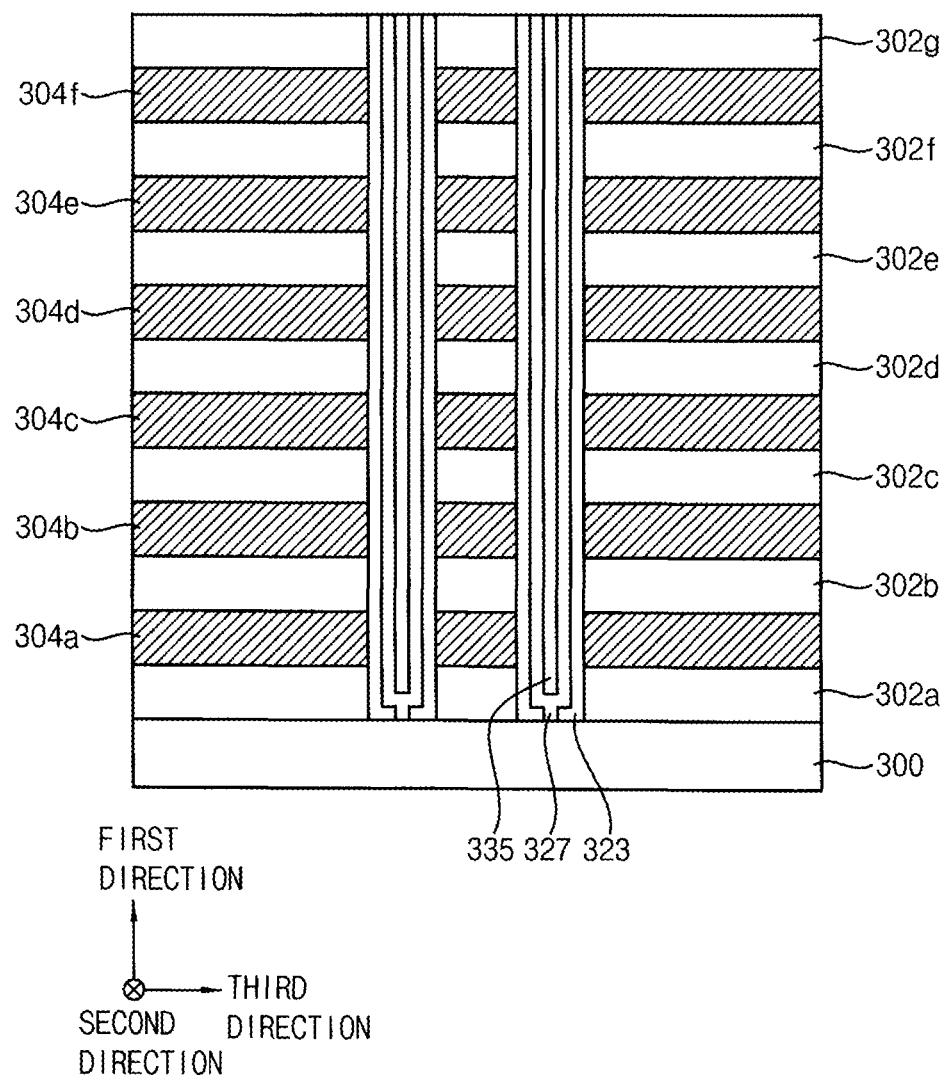

Referring to FIG. 13, the first filling layer 330, the channel layer 325 and the dielectric layer 320 may be planarized until the uppermost insulating interlayer 302g is exposed to form a dielectric layer structure 323, a channel 327 and a first filling layer pattern 335 sequentially stacked in the channel hole 310. The planarization process may include an etch-back process or a chemical mechanical polish (CMP) process.

In example embodiments, the dielectric layer structure 323 may have a substantially hollow cylindrical shape or a straw shape. The channel 327 may have a substantial cup shape. The first filling layer pattern 335 may have a substantially solid cylindrical shape or a substantially pillar shape.

In example embodiments, if the channel layer 325 fully fills the channel hole 310, the first filling layer pattern 335 may be omitted and the channel 327 may have a substantially solid cylindrical shape or a substantially pillar shape.

A plurality of the channels 327 filling the channel holes 310 may be formed, such that a channel row and a channel array may be defined comparable to the channel hole row and the channel hole array.

In example embodiments, after the formation of the channel hole 310 and before the formation of the dielectric layer 320, a semiconductor pattern (not illustrated) filling a lower portion of the channel hole 310 may be formed. The semiconductor pattern may be formed by a selective epitaxial growth (SEG) process using the substrate 300 as a seed. A top surface of the semiconductor pattern may be located between a top surface of a first sacrificial layer 304a and a bottom of a second sacrificial layer 304b. In this case, the dielectric layer structure 323 and the channel 327 may be formed on the top surface of the semiconductor pattern.

Figure 14:
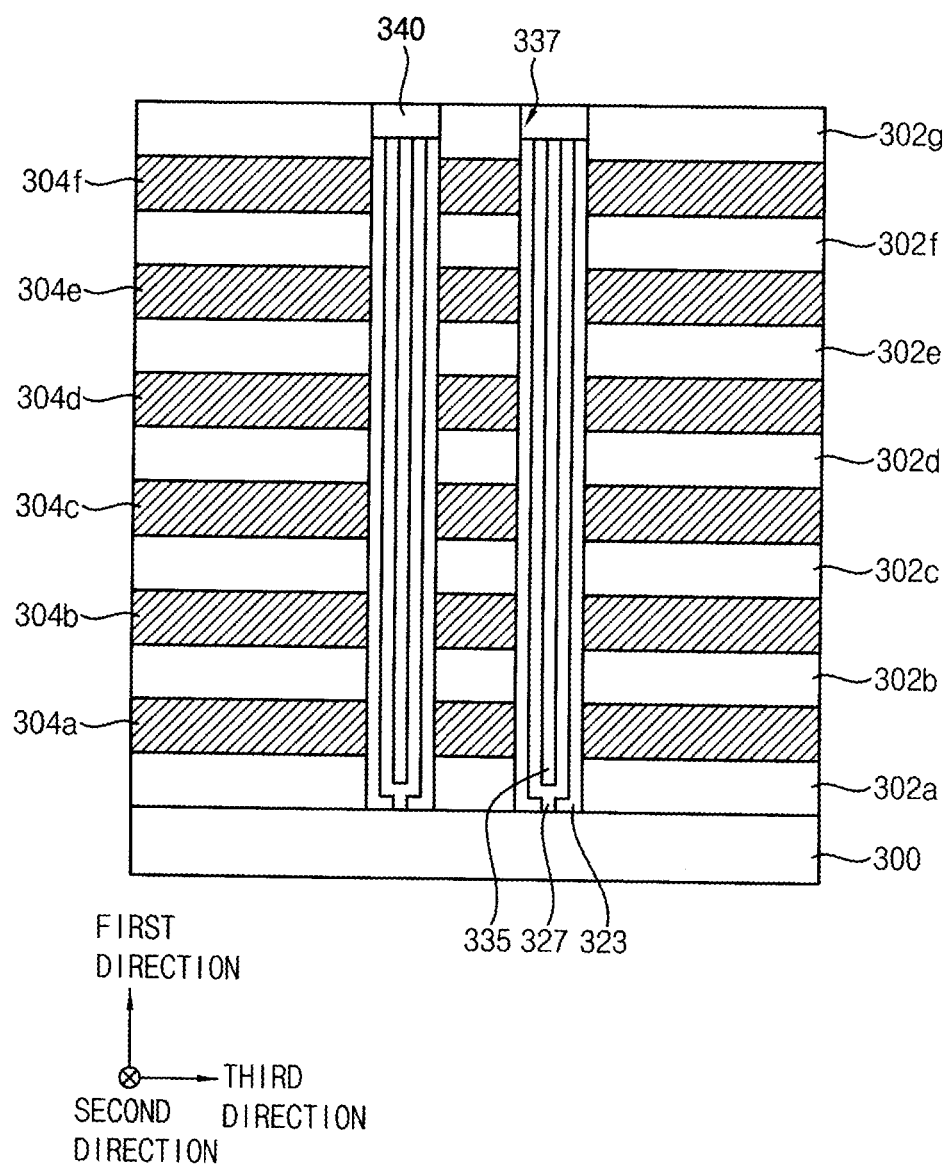
Figure 15A:
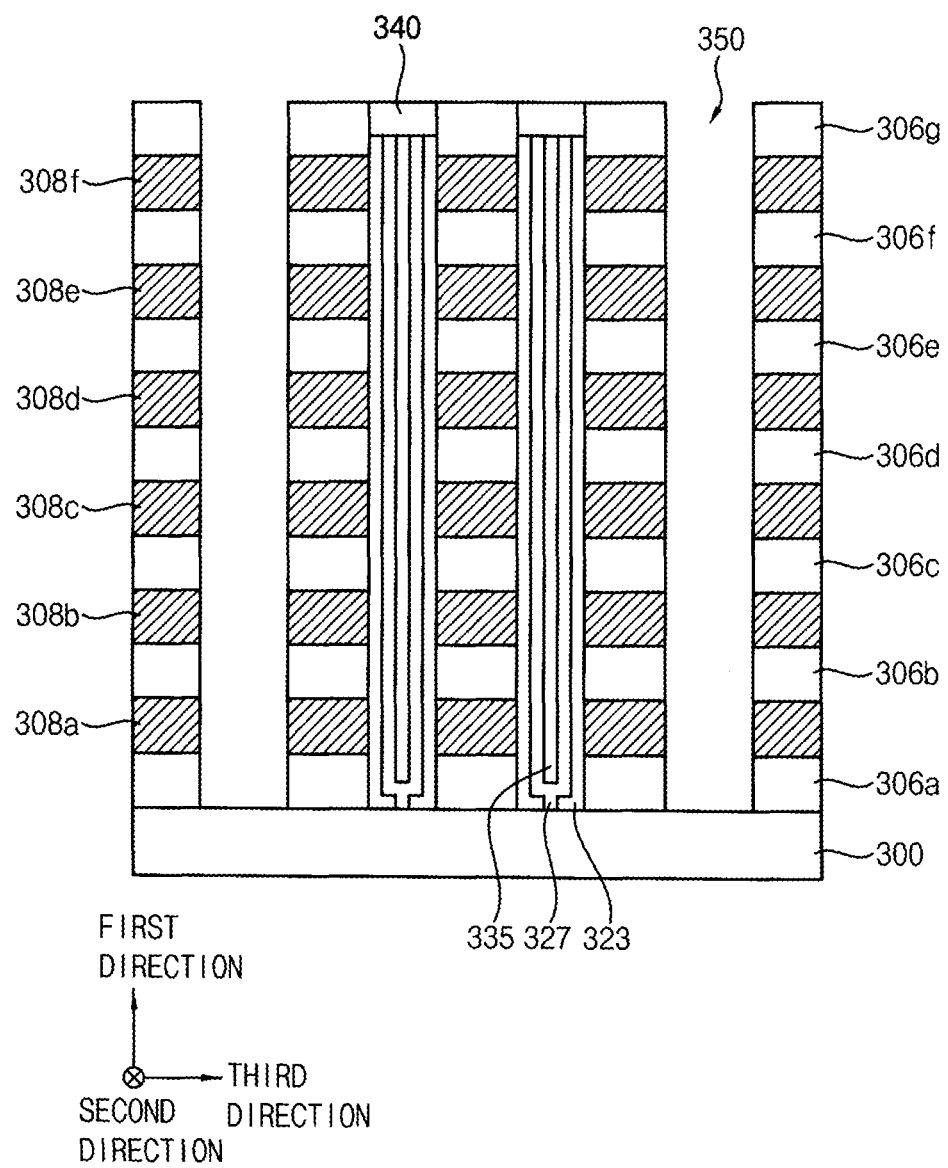
Figure 15B:
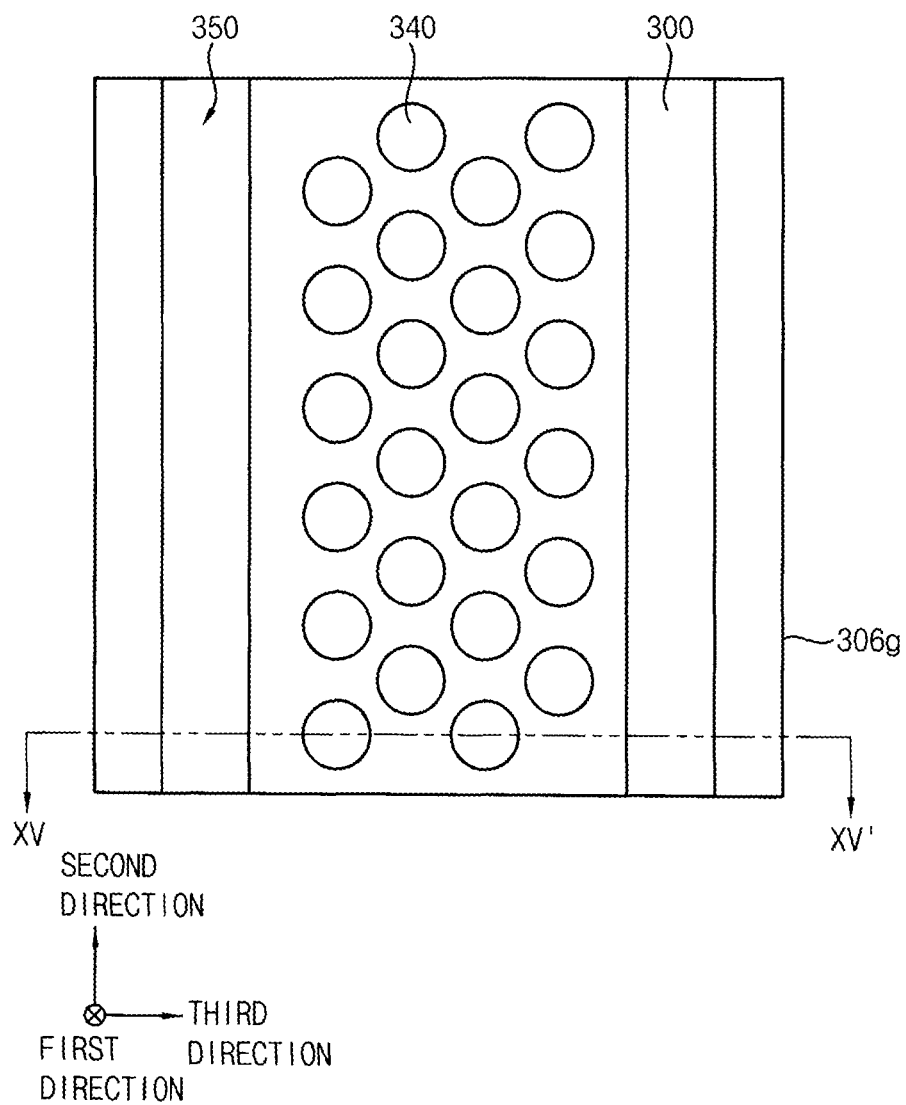

Referring to FIG. 14, a pad 340 capping an upper portion of the channel hole 310 may be formed on the dielectric layer structure 323, the channel 327 and the first filling layer pattern 335.

In example embodiments, upper portions of the dielectric layer structure 323, the channel 327 and the first filling layer pattern 335 may be removed by an etch-back process to form a recess 337. A bottom of the recess 337 may be higher than a top surface of an uppermost sacrificial layer 304f. A pad layer sufficiently filling the recess 337 may be formed on the dielectric layer structure 323, the channel 327, the first filling layer pattern 335 and the uppermost insulating interlayer 302g. An upper portion of the pad layer may be planarized until a top surface of the uppermost insulating interlayer 302g is exposed to obtain the pad 340.

In example embodiments, the pad layer may be formed using polysilicon optionally doped with n-type impurities by, e.g., a CVD process. In example embodiments, a preliminary pad layer may be formed using amorphous silicon, and then a crystallization process may be performed thereon to form the pad layer. The planarization process may include a CMP process.

Referring to FIGS. 15A and 15B, openings 350 extending through the insulating interlayers 302 and the sacrificial layers 304 may be formed.

For example, a mask pattern (not illustrated) covering the pads 340 may be formed on the uppermost insulating interlayer 302g. A dry etching process may be performed using the mask pattern as an etching mask, such that portions of the insulating interlayers 302 and the sacrificial layers 304 between some of the neighboring channel rows may be removed to form the openings 350. The hard mask may be formed using a photoresist material or an SOH material. The hard mask may be removed by an ashing process and/or a strip process after the formation of the openings 350.

The opening 350 may extend linearly in the second direction, and a plurality of the openings 350 may be formed along the third direction. In example embodiments, four channel rows may be included between the openings 350 neighboring in the third direction as illustrated in FIG. 15B. However, the number of the channel rows included between the openings 350 may be adjusted in consideration of the circuit design and/or the degree of integration of the vertical memory device.

The insulating interlayers 302 and the sacrificial layers 304 may be changed into insulating interlayer patterns 306 and sacrificial layer patterns 308, respectively, by the formation of the openings 350. The insulating interlayer pattern 306 and the sacrificial layer pattern 308 may have a linear shape surrounding at least one of the channel rows. The opening 350 may serve as a gate electrode cut region by which gate electrodes 370 (see FIG. 18) are separated per each level. The top surface of the substrate 300 may be exposed through the opening 350.

Figure 16:
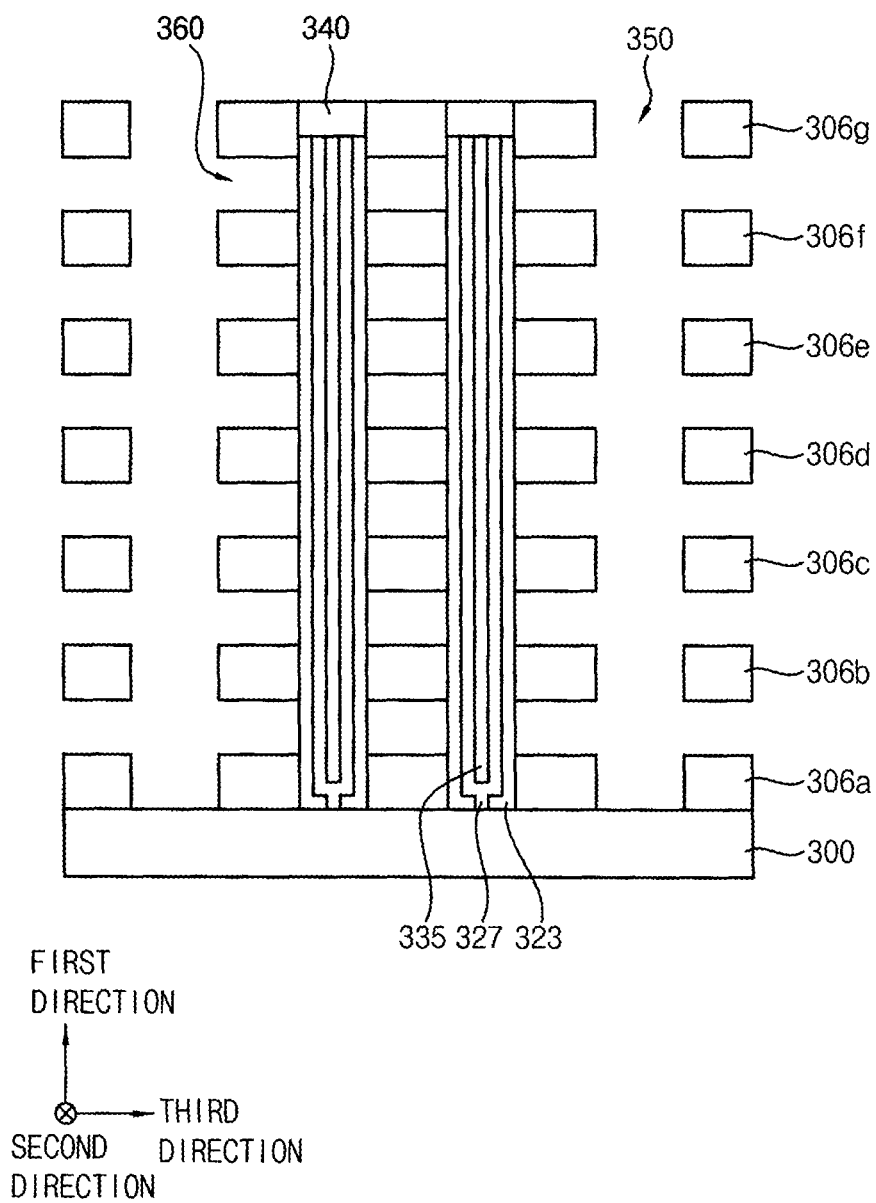

Referring to FIG. 16, the sacrificial layer patterns 308, sidewalls of which are exposed by the opening 350 may be removed. For example, the sacrificial layer patterns 308 may be removed by a wet etching process using an etchant solution that may have an etching selectivity for silicon nitride. The etchant solution may include an acid solution such as sulfuric acid.

By the removal of the sacrificial layer patterns 308, gaps 360 may be defined between the insulating interlayer patterns 306 adjacent in the first direction. An outer sidewall of the dielectric layer structure 323 may be partially exposed by the gap 360.

Figure 17:
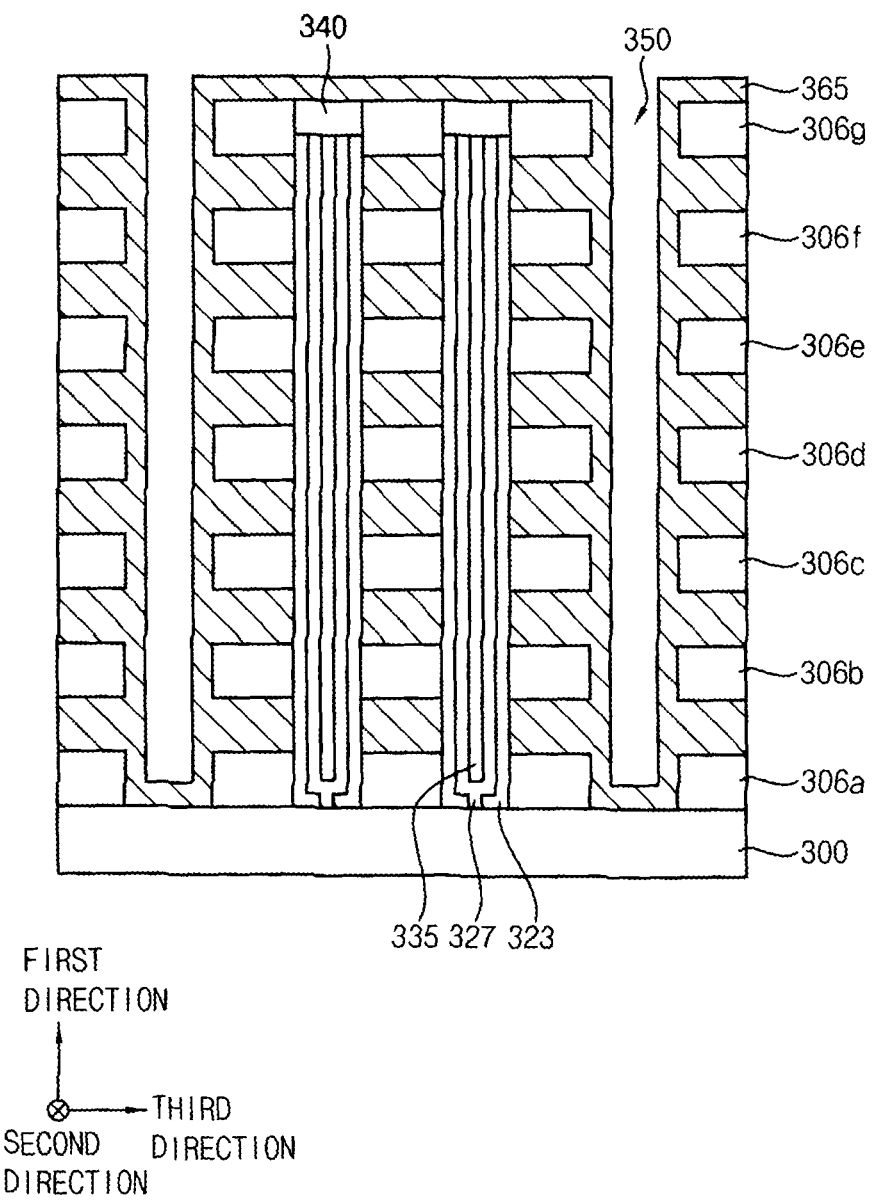

Referring to FIG. 17, a gate electrode layer 365 may be formed on the outer sidewall of the dielectric layer structure 323, an innerwall of the gap 360, a top surface of the pad 340, surfaces of the insulating interlayer patterns 306 and the top surface of the substrate 300. In example embodiments, the gate electrode layer 365 may sufficiently fill the gaps 360 and may partially fill the openings 350.

In example embodiments, the gate electrode layer 365 may be formed using a metal, e.g., titanium, tantalum, tungsten, aluminum, copper, molybdenum, zirconium, hafnium, chromium or nickel, or a nitride thereof. In example embodiments, the gate electrode layer 365 may be formed as a multi-layered structure including a metal nitride layer and a metal layer. The gate electrode layer 365 may be formed by a sputtering process, an ALD process, a CVD process or a PVD process.

In example embodiments, a second blocking layer including silicon oxide or a metal oxide may be further formed before forming the gate electrode layer 365.

Figure 18:
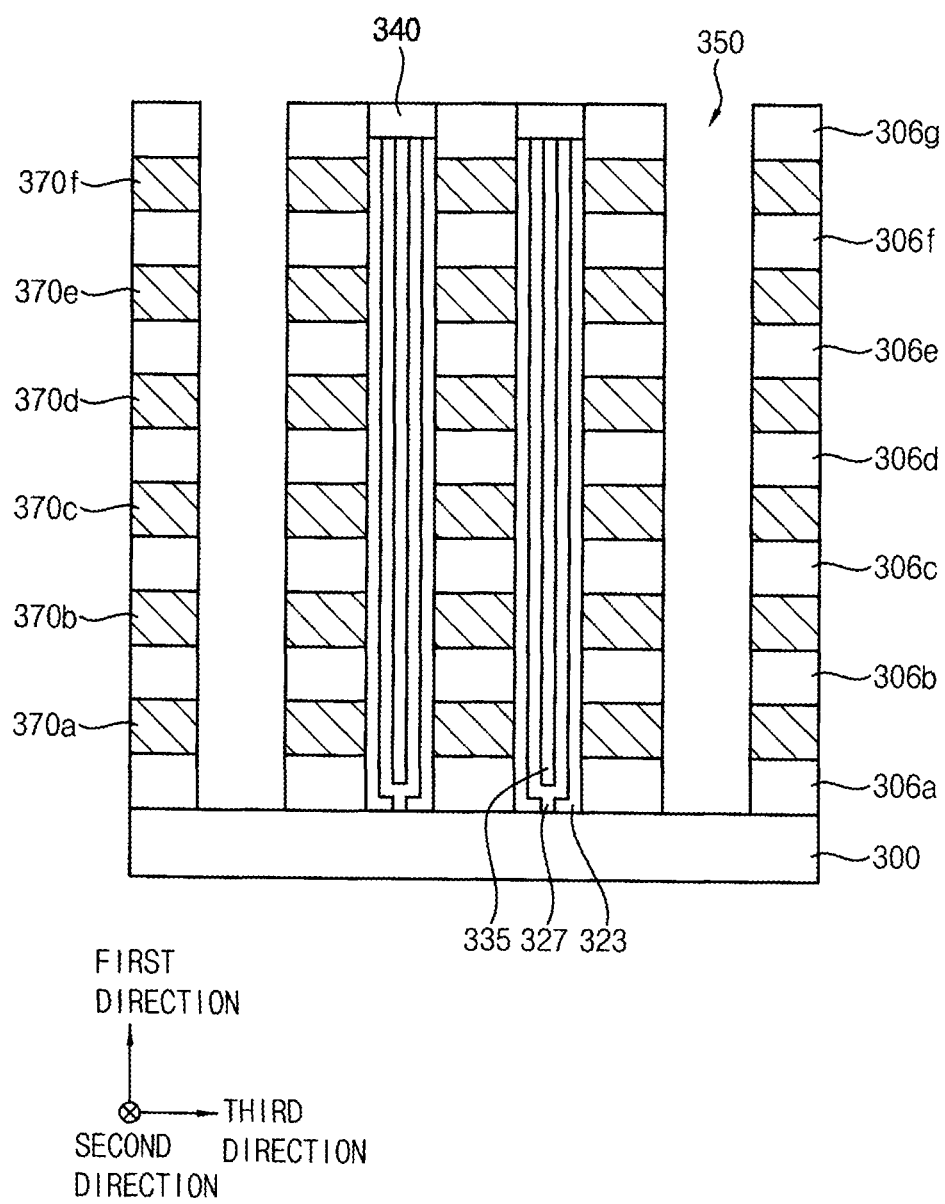

Referring to FIG. 18, the gate electrode layer 365 may be partially etched to form a gate electrode 370 in the gap 360 of each level. The gate electrode 370 may have a linear shape extending in the second direction and surrounding the channels 327 included in the channel row. In example embodiments, each gate electrode 370 may surround four of the channel rows.

In example embodiments, upper portions of the gate electrode layer 365 may be planarized by, e.g., a CMP process until a top surface of an uppermost insulating interlayer pattern 306g is exposed. The top surface of the pad 340 may be also exposed by the planarization process. A portion of the gate electrode layer 365 formed in the opening 350 may be etched to form the gate electrode 370 in each gap 360. The etching process for the gate electrode layer 365 may include a wet etching process using the etchant composition that may have an etching selectivity for a metal and/or a metal nitride. For example, the etchant composition may contain phosphoric acid or hydrogen peroxide.

The gate electrodes 370 may include the GSL, the word line and the SSL sequentially stacked and spaced apart from each other in the first direction. For example, a lowermost gate electrode 370a may serve as the GSL. Four gate electrodes 370b, 370c, 370d and 370e on the GSL may serve as the word line. An uppermost gate electrode 370f on the word line may serve as the SSL. However, the stacked number of the GSL, the word line and the SSL may be properly adjusted in consideration of the circuit design and the degree of integration of the vertical memory device.

In example embodiments, if the second blocking layer is formed before forming the gate electrode layer 365, a second blocking layer pattern may be formed in each gap 360, and the gate electrode 370 may be formed on the second blocking layer pattern.

In example embodiments, if the semiconductor pattern is formed at the lower portion of the channel hole 310, the gate electrode 370a serving as the GSL may surround a lateral portion of the semiconductor pattern.

Figure 19:
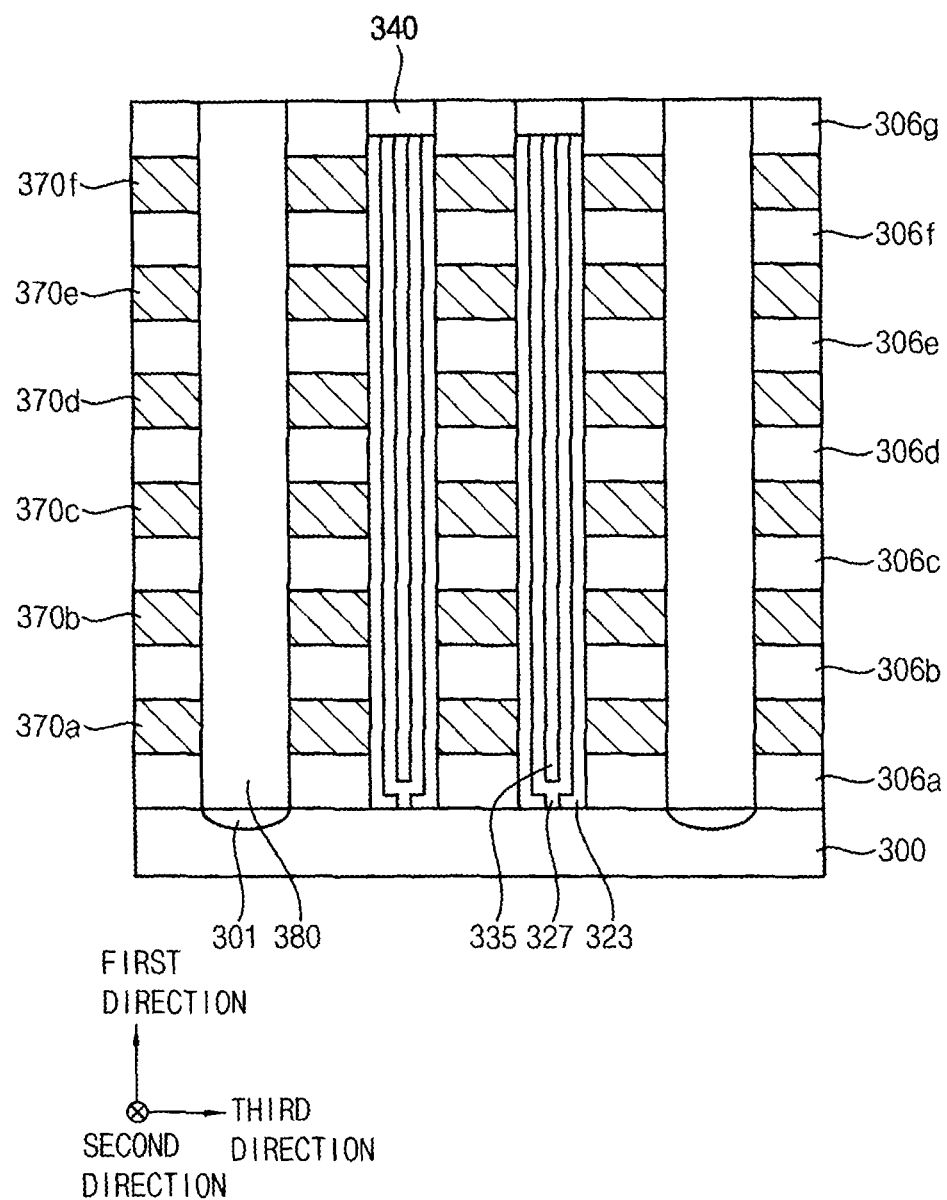

Referring to FIG. 19, an impurity region 301 may be formed at an upper portion of the substrate 300 exposed by the opening 350, and a second filling layer pattern 380 filling the opening 350 may be formed on the impurity region 301.

For example, an ion implantation mask (not illustrated) covering the pads 340 may be formed on the uppermost insulating interlayer pattern 306g. N-type impurities such as phosphorous (P) or arsenic (As) may be implanted through the opening 350 to form the impurity region 301. The impurity region 301 may extend in the second direction and serve as a common source line (CSL) of the vertical memory device. In example embodiments, a metal silicide pattern, e.g., a cobalt silicide pattern or a nickel silicide pattern may be further formed on the impurity region 301.

A second filling layer may be formed on the substrate 300, the uppermost insulating interlayer pattern 306g and the pad 340 to sufficiently fill the openings 350. An upper portion of the second filling layer may be planarized by, e.g., a CMP process or an etch-back process until the uppermost insulating interlayer pattern 306g is exposed to form the second filling layer pattern 380. The second filling layer may be formed using an insulation material, e.g., silicon oxide by, e.g., an ALD process.

In example embodiments, the second filling layer may be formed by processes substantially the same as or similar to those illustrated with reference to FIGS. 1 to 8B.

Figure 20:
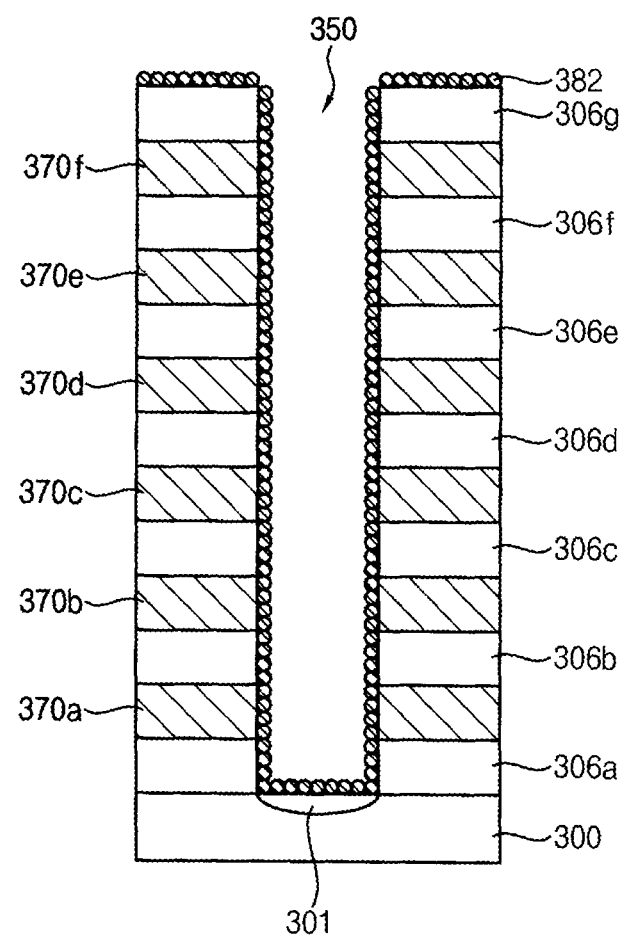
Figure 21:
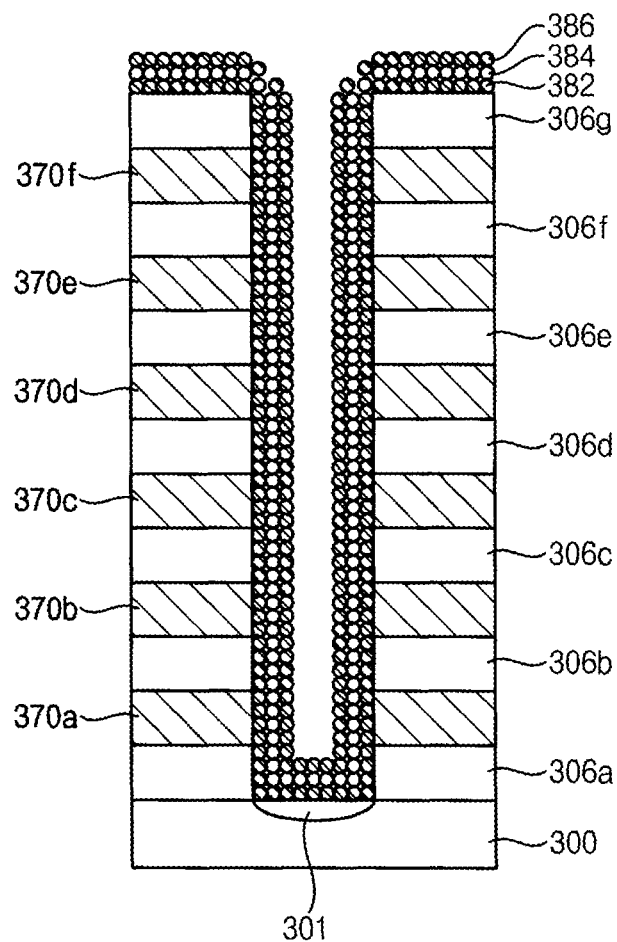

FIGS. 20 and 21 are enlarged cross-sectional views of a region adjacent to the opening 350. For convenience of explanation, a size of an atom is exaggerated in FIGS. 20 and 21.

Referring to FIG. 20, a plurality of structures on which processes illustrated in FIGS. 9 to 18 are performed and the impurity regions 301 are formed may be loaded on slots of a susceptor placed in a deposition chamber for an ALD process. The deposition chamber may include a precursor flow path and an oxidizing agent flow path disposed on the susceptor.

While rotating the susceptor, a preliminary precursor flow including a silicon precursor may be introduced through the precursor flow path. Accordingly, a preliminary precursor layer 382 may be formed along the uppermost insulating interlayer pattern 306g, a sidewall of the opening 350, and a top surface of the impurity region 301. The preliminary precursor layer 382 may be formed substantially as a silicon atomic layer structure.

Referring to FIG. 21, while rotating the susceptor, a precursor flow and a first oxidizing agent flow may be simultaneously introduced into the deposition chamber through the precursor flow path and the oxidizing agent flow, respectively. The first oxidizing agent flow may include a mixture gas of hydrogen and oxygen having a strong oxidizing power.

Accordingly, a first oxidizing agent layer 384 and a precursor layer 386 may be formed on the preliminary precursor layer 382. FIG. 21 illustrates that each of the first oxidizing agent layer 384 and the precursor layer 386 is formed as a single level. However, a plurality of the first oxidizing agent layers 384 and the precursor layers 386 may be formed alternately and repeatedly.

FIG. 21 illustrates that the first oxidizing agent layer 384 may be formed on the preliminary precursor layer 382 in advance of the precursor layer 386. However, as illustrated in FIG. 5A, the precursor layer 386 may be formed on the preliminary precursor layer 382 in advance of the first oxidizing agent layer 384 on some of the slots. As a result, a deviation of layer thickness on the slots may be generated.

Thus, as illustrated in FIGS. 7, 8A and 8B, the precursor flow may be ceased before the slots including the structure of FIG. 21 enter a precursor deposition region prior to completing a last rotation of the susceptor for the formation of the first oxidizing agent layer 384 and the precursor layer 386. Accordingly, a uniform oxide layer may be formed in the opening 350 throughout all the slots.

Next, while rotating the susceptor, a second oxidizing agent flow may be introduced into the deposition chamber through the oxidizing agent flow to form the second filling layer in the opening 350.

As the degree of integration of the vertical memory device becomes larger, a width of the openings 350 may be reduced and an aspect ratio of the opening 350 may be increased. Thus, a strong oxidizing agent may be required to form the second filling layer having sufficient insulation properties in the opening 350. In example embodiments, the mixture gas of hydrogen and oxygen having an oxidizing power stronger than those of oxygen and ozone may be used to achieve the desired insulation properties of the second filling layer.

Additionally, the preliminary precursor flow may be introduced before the oxidizing agent contacts the gate electrode 370 and the impurity region 301 to form the preliminary precursor layer 382. Thus, an oxidation of the gate electrode 370 and the impurity region 301 and/or an oxygen diffusion into the gate electrode 370 and the impurity region 301 may be limited (and/or prevented).

Figure 22:
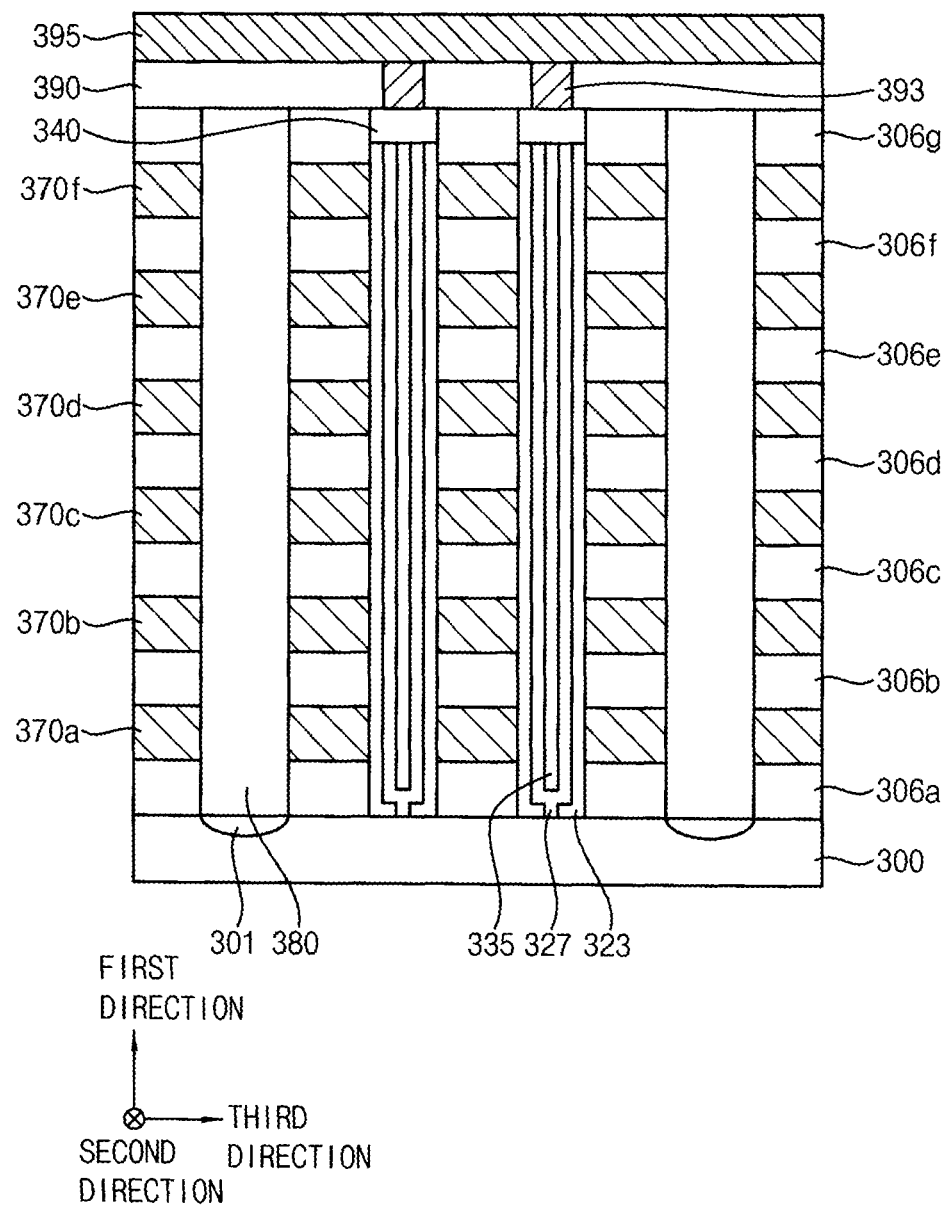

Referring to FIG. 22, an upper insulation layer 390 may be formed on the uppermost insulating interlayer pattern 306g, the second filling layer pattern 380 and the pad 340. The upper insulation layer 390 may be formed using an insulation material, e.g., silicon oxide by, e.g., a CVD process or a spin coating process.

In example embodiments, the second filling layer may be formed to sufficiently filling the openings 350 and cover the uppermost insulating interlayer pattern 306g and the pad 340. In this case, the formation of the upper insulation layer 390 may be omitted.

A bit line contact 393 may be formed through the upper insulation layer 390 to contact the pad 340. A bit line 395 may be formed on the upper insulation layer 390 to be electrically connected to the bit line contact 393. The bit line contact 393 and the bit line 395 may be formed using a metal, a metal nitride or doped polysilicon by a PVD process, an ALD process or a sputtering process.

A plurality of the bit line contacts 393 may be formed according to an arrangement of the pads 340 to form a bit line contact array. The bit line 395 may be electrically connected to a plurality of the pads 340 via the bit line contacts 390. The bit line 395 may extend in the third direction, and a plurality of the bit lines 395 may be formed along the second direction.

FIGS. 23 to 29 are cross-sectional views illustrating a method of manufacturing a semiconductor device in accordance with example embodiments. For example, FIGS. 23 to 29 illustrate a method of manufacturing a dynamic random access memory (DRAM) device including a capacitor.

Figure 23:
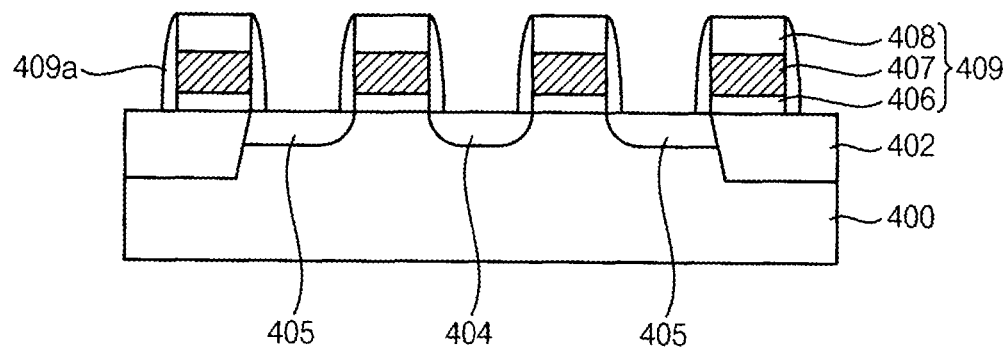
FIGS. 23 to 29 are cross-sectional views illustrating a method of manufacturing a semiconductor device in accordance with example embodiments.

Referring to FIG. 23, an isolation layer 402 may be formed on a substrate 400. For example, the isolation layer 402 may be formed by a shallow trench isolation (STI) process.

A gate insulation layer, a gate electrode layer and a gate mask layer may be sequentially formed on the substrate 400 and may be patterned by a photolithography process to form gate structures 409, each of which may include a gate insulation layer pattern 406, a gate electrode 407 and a gate mask 408. The gate insulation layer may be formed using silicon oxide or a metal oxide. The gate electrode layer may be formed using doped polysilicon, a metal or a metal nitride. The gate mask layer may be formed using silicon nitride.

An ion implantation process may be formed using the gate structure 409 as an implantation mask to form first and second impurity regions 404 and 405 at upper portions of the substrate 400 adjacent to the gate structures 409. The first and second impurity regions 404 and 405 may serve as source and drain regions of a transistor including the gate structure 409. A spacer 409a including silicon nitride may be further formed on a sidewall of the gate structure 409.

Figure 24:
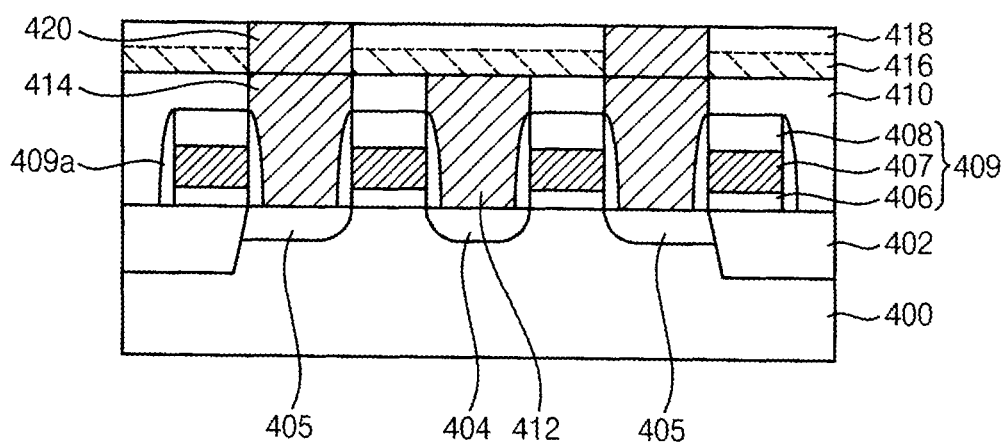

Referring to FIG. 24, a first insulating interlayer 410 covering the gate structure 409 and the spacer 406a may be formed on the substrate 400. The first insulating interlayer 410 may be partially removed to form first holes through which the impurity regions 404 and 405 are exposed. In example embodiments, the first holes may be self-aligned with the gate structure 409 and the spacer 409a.

A first conductive layer filling the first holes may be formed on the substrate 400 and the first insulating interlayer 410. An upper portion of the first conductive layer may be planarized by a CMP process until a top surface of the first insulating interlayer 410 is exposed. Accordingly, a first plug 412 and a second plug 414 may be formed in the first holes. The first plug 412 and the second plug 414 may be in contact with the first impurity region 404 and the second impurity region 405, respectively. The first plug 412 may serve as a bit line contact.

A second conductive layer contacting the first plug 412 may be formed on the first insulating interlayer 410, and patterned to form a bit line 416. A second insulating interlayer 418 covering the bit line 416 may be formed on the first insulating interlayer 410.

The second insulating interlayer 418 may be partially etched to form second holes through which the second plugs 414 are exposed. A third conductive layer filling the second holes may be formed on the second plug 414 and the second insulating interlayer 418. An upper portion of the third conductive layer may be planarized by a CMP process or an etch-back process until a top surface of the second insulating interlayer 418 is exposed to form third plugs 420 in the second holes. The second and third plugs 414 and 420 may serve as a capacitor contact. Alternatively, the third plug 420 may be formed through the first and second insulating interlayers 410 and 418 to directly contact the second impurity region 405. In this case, the second plug 414 may be omitted, and the third plug 420 may solely serve as the capacitor contact.

The first to third conductive layers may be formed using a metal, a metal nitride or doped polysilicon.

Figure 25:
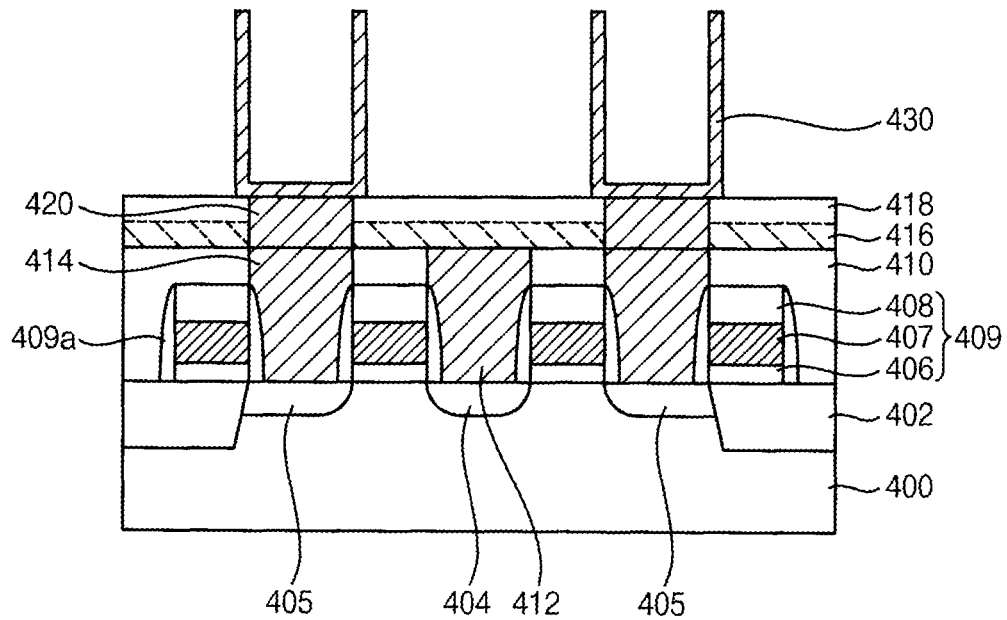

Referring to FIG. 25, a lower electrode 430 electrically connected to the third plug 420 may be formed.

For example, an etch-stop layer (not illustrated) and a mold layer (not illustrated) may be formed on the second insulating interlayer 418. The mold layer and the etch-stop layer may be partially removed to form an opening (not illustrated) through which a top surface of the third plug 420 is exposed.

A lower electrode layer may be formed along an innerwall of the opening and a top surface of the mold layer. The lower electrode layer may be formed using a metal or a metal nitride, such as tungsten, tungsten nitride, titanium, titanium nitride, tantalum, tantalum nitride, ruthenium, etc. A sacrificial layer (not illustrated) may be formed on the lower electrode layer, and then upper portions of the sacrificial layer and the lower electrode layer may be planarized until the top surface of the mold layer is exposed. The sacrificial layer and the mold layer may be removed to form the lower electrode 430.

Figure 26:
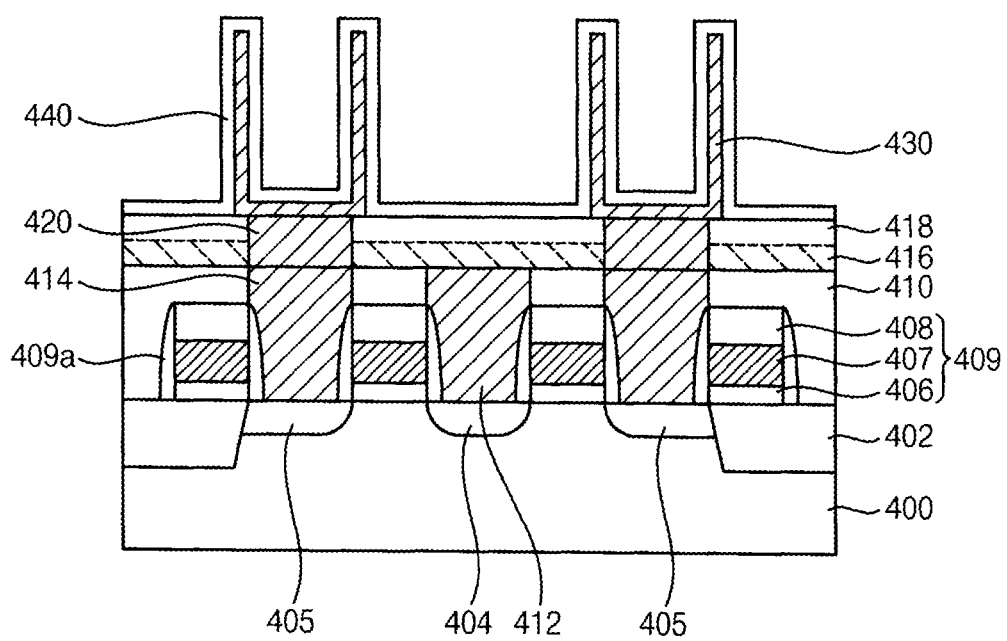

Referring to FIG. 26, a dielectric layer 440 covering the lower electrode 430 may be formed. The dielectric layer 440 may be formed using, e.g., a metal oxide having a high dielectric constant. In example embodiments, the dielectric layer 440 may be formed by processes substantially the same as or similar to those illustrated with reference to FIGS. 1 to 8B.

Figure 27:
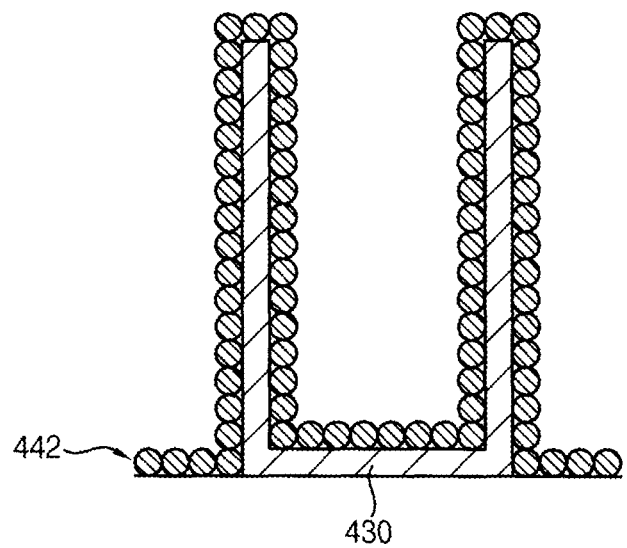
Figure 28:
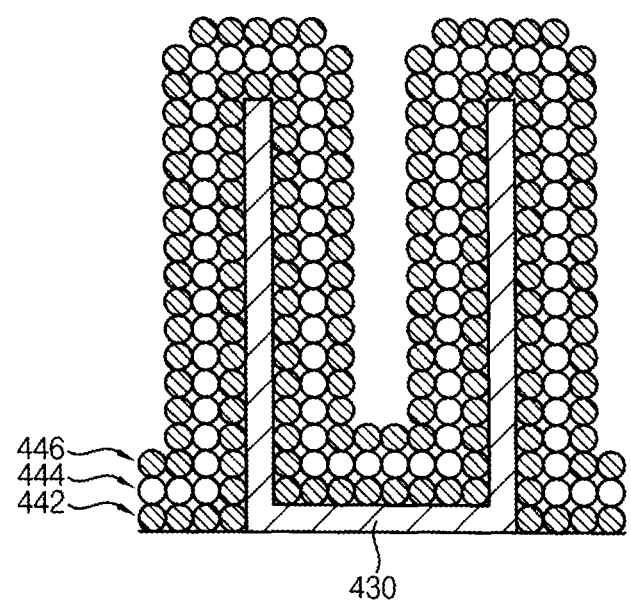

FIGS. 27 and 28 are enlarged cross-sectional views of a region adjacent to the lower electrode 430 illustrating a mechanism of forming the dielectric layer. For convenience of explanation, a size of an atom is exaggerated in FIGS. 27 and 28.

Referring to FIG. 27, a plurality of structures on which processes illustrated in FIGS. 23 to 25 are performed may be loaded on slots of a susceptor placed in a deposition chamber for an ALD process. The deposition chamber may include a precursor flow path and an oxidizing agent flow path disposed on the susceptor.

While rotating the susceptor, a preliminary precursor flow may be introduced through the precursor flow path. In example embodiments, an organometallic precursor including a central metal atom may be used as a precursor material. The organometallic precursor may include $Zr(OtBu)_4$, TEMAZ, TDMAZ, TDEAZ, $Hf(OtBu)4$, TEMAH, TDMAH, TDEAH, TMA, or the like.

Accordingly, a preliminary precursor layer 442 may be formed along surfaces of the lower electrode 430 and the etch-stop layer. The preliminary precursor layer 442 may be formed substantially as a metal atomic layer structure, e.g., a hafnium atomic layer or a zirconium atomic layer.

Referring to FIG. 28, while rotating the susceptor, a precursor flow including the organometallic precursor and a first oxidizing agent flow may be simultaneously introduced into the deposition chamber through the precursor flow path and the oxidizing agent flow, respectively. The first oxidizing agent flow may include a mixture gas of hydrogen and oxygen having a strong oxidizing power.

Accordingly, a first oxidizing agent layer 444 and a precursor layer 446 may be formed on the preliminary precursor layer 442. FIG. 28 illustrates that each of the first oxidizing agent layer 444 and the precursor layer 446 is formed as a single level. However, a plurality of the first oxidizing agent layers 444 and the precursor layers 446 may be formed alternately and repeatedly.

As illustrated in FIG. 5A, the precursor layer 446 may be formed on the preliminary precursor layer 442 in advance of the first oxidizing agent layer 444 on some of the slots. As a result, a deviation of layer thickness on the slots may be generated.

Thus, as illustrated in FIGS. 7, 8A and 8B, the precursor flow may be ceased before the slots including the structure of FIG. 28 enter a precursor deposition region prior to completing a last rotation of the susceptor for the formation of the first oxidizing agent layer 444 and the precursor layer 446. Accordingly, a uniform oxide layer may be formed on the lower electrode 430 throughout all the slots.

Next, while rotating the susceptor, a second oxidizing agent flow may be introduced into the deposition chamber through the oxidizing agent flow to form the dielectric layer 440 on the lower electrode 430 as illustrated in FIG. 26.

According to example embodiments, the mixture gas of hydrogen and oxygen having an oxidizing power stronger than those of oxygen and ozone may be used to achieve the desired dielectric properties of the dielectric layer 440. Additionally, the preliminary precursor flow may be introduced before the oxidizing agent contacts the lower electrode 430 to form the preliminary precursor layer 442. Thus, the lower electrode 430 may be limited (and/or prevented) from being oxidized by the oxidizing agent.

Figure 29:
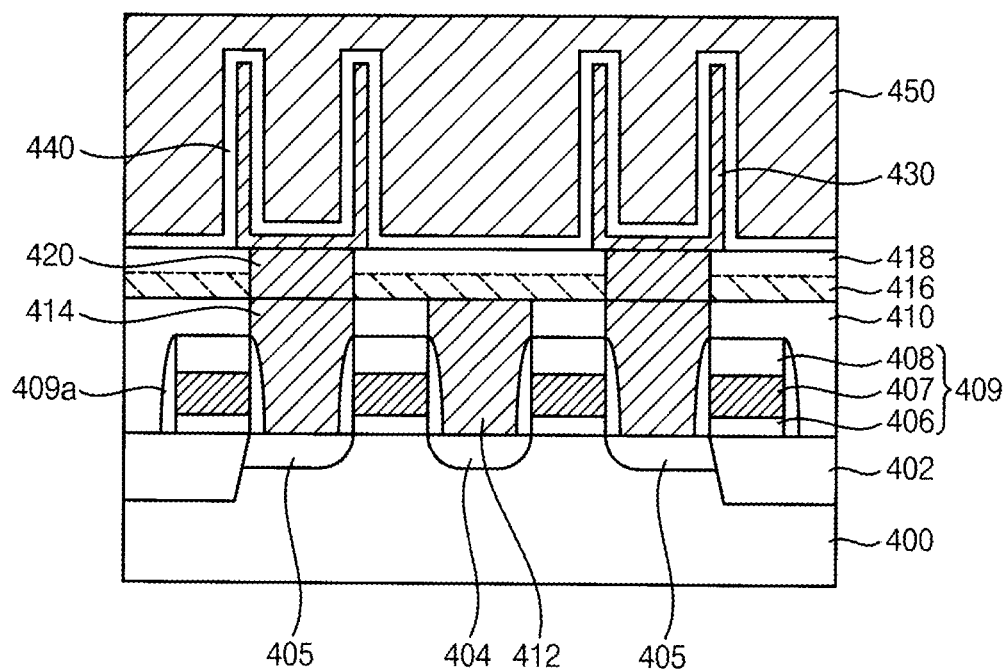

Referring to FIG. 29, an upper electrode 450 may be formed on the dielectric layer 440. The upper electrode 450 may be formed using a metal or a metal nitride, such as tungsten, tungsten nitride, titanium, titanium nitride, tantalum, tantalum nitride, ruthenium, etc., by, e.g., a sputtering process or an ALD process.

Accordingly, the DRAM device including a capacitor defined by the lower electrode 430, the dielectric layer 440 and the upper electrode 450 may be obtained.

The methods of forming an oxide layer as described above may be implemented to form a dielectric or an insulation layer on, e.g., a gate electrode or a metal wiring of various semiconductor devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the spirit and scope of the claims.

In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the claims.

What is claimed is:

1. A method of manufacturing an oxide layer of a semiconductor device, comprising:
    forming a stacked structure that includes a plurality of channels extending through a plurality of insulating interlayer patterns and gate electrodes alternately stacked on each other on a substrate, the plurality of insulating interlayer patterns and gate electrodes defining at least one opening that exposes a portion of the substrate;
    providing a preliminary precursor flow on an innerwall of the at least one opening to form a preliminary precursor layer on the innerwall;
    providing a precursor flow and a first oxidizing agent flow on the preliminary precursor layer alternately and repeatedly to form precursor layers and first oxidizing agent layers alternately stacked on each other, the first oxidizing agent flow including a mixture gas of hydrogen ($H_2$) and oxygen ($O_2$) which are concurrently introduced, wherein hydrogen creates oxygen radicals from oxygen; and
    providing a second oxidizing agent flow on the precursor layers and first oxidizing agent layers alternately stacked on each other to form a filling layer in the opening.

2. The method of claim 1, wherein
    the preliminary precursor flow and the precursor flow include a silicon precursor having ligands combined to a silicon atom, and
    the second oxidizing agent flow includes another mixture gas of hydrogen ($H_2$) and oxygen ($O_2$).

3. The method of claim 1, further comprising:
forming an impurity region at an upper part of the portion of the substrate exposed by the opening.

4. A method of forming an oxide layer of a semiconductor device, comprising:
forming a preliminary precursor layer on an object by performing a deposition process using a preliminary precursor material in a chamber containing the object, the object including an object layer on a substrate, the deposition process being performed by providing a preliminary precursor flow in an atmosphere deficient in oxygen, the forming the preliminary precursor layer including limiting the oxidation of the object layer prior to forming the preliminary precursor layer;
forming a plurality of precursor layers and first oxidizing agent layers alternately on each other by alternately performing a deposition process using a precursor material and performing a deposition process using a first mixture including an oxidizing gas in the chamber containing the object after the forming the preliminary precursor layer; and
forming a second oxidizing agent layer on the plurality of precursor layers and first oxidizing agent layers by performing a deposition process using a second mixture including an oxidizing gas in the chamber containing the object.

5. The method of claim 4, wherein
the deposition process using the preliminary precursor material and the deposition process using the precursor material are an atomic layer deposition (ALD) process excluding at least one of oxygen ($O_2$) and ozone ($O_3$) gas, and
a temperature of the chamber containing the object is maintained in range of about 400° C. to about 800° C. during the deposition process using the preliminary precursor material and the deposition process using the precursor material.

6. The method of claim 4, wherein
the preliminary precursor material is one of a silicon precursor having ligands combined to a silicon atom and an organometallic precursor having ligands combined to a metal atom, and
the precursor material is one of a silicon precursor having ligands combined to a silicon atom and an organometallic precursor having ligands combined to a metal atom.

7. The method of claim 4, wherein
the first and second mixtures include hydrogen ($H_2$),
the oxidizing gas in the first and second mixtures includes oxygen ($O_2$).

8. The method of claim 4, wherein
the chamber is a deposition chamber in an atomic layer deposition (ALD) apparatus,
the ALD apparatus includes a susceptor configured to be rotated and to support the object if the object is a wafer, a conduit structure defining an oxidizing agent flow path into the chamber over the susceptor, and a conduit structure defming a precursor flow path into the chamber over the susceptor,
the ALD apparatus is configured to form a preliminary precursor deposition region or precursor deposition region in the chamber, respectively, by providing the preliminary precursor material or precursor material, respectively, through the precursor flow path into the chamber and excluding at least one of oxygen ($O_2$) and ozone ($O_3$) gas in the chamber during the providing the preliminary precursor material or precursor material,
the ALD apparatus is configured to form a first oxidizing agent deposition region or a second oxidizing agent deposition region in the chamber, respectively, by providing the first mixture including an oxidizing gas or the second mixture including an oxidizing gas through the oxidizing agent flow path into the chamber,
the forming the preliminary precursor layer includes forming the preliminary precursor region in the chamber and rotating the susceptor while the object is on the susceptor so the object passes through preliminary precursor region, and
the forming the plurality of precursor layers and first oxidizing layers alternately on each other includes repeatedly forming the precursor region and the first oxidizing agent region in the chamber, and rotating the susceptor while the object is on the susceptor so the object repeatedly passes through the precursor region and the first oxidizing agent region in the chamber, and
the forming the second oxidizing agent layer includes forming the second oxidizing agent region in the chamber and rotating the susceptor while the object is on the susceptor so the object passes through the second oxidizing agent region.

* * * * *